(12) United States Patent
Park et al.

(10) Patent No.: US 11,489,027 B2
(45) Date of Patent: Nov. 1, 2022

(54) DISPLAY APPARATUS AND METHOD OF MANUFACTURING THE SAME

(71) Applicant: SAMSUNG DISPLAY CO., LTD., Yongin-si (KR)

(72) Inventors: Gwui-Hyun Park, Yongin-si (KR); Chulwon Park, Yongin-si (KR); Pil Soon Hong, Yongin-si (KR); Hyunjin Son, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/569,744

(22) Filed: Sep. 13, 2019

(65) Prior Publication Data
US 2020/0135822 A1    Apr. 30, 2020

(30) Foreign Application Priority Data
Oct. 24, 2018   (KR) ........................ 10-2018-0127436

(51) Int. Cl.
*H01L 27/32*   (2006.01)
*H01L 51/56*   (2006.01)

(52) U.S. Cl.
CPC ...... *H01L 27/3258* (2013.01); *H01L 27/3248* (2013.01); *H01L 51/56* (2013.01)

(58) Field of Classification Search
CPC . H01L 27/3258; H01L 27/3248; H01L 51/56; H01L 27/124; H01L 2251/558; H01L 27/1248; H01L 27/3276; H01L 51/50–56; H01L 51/0032–0095; H01L 27/32; H01L 2251/50–568; H01L 29/4908; H01L 29/66742–6678; H01L 29/786–78696; H01L 27/12–13;
(Continued)

(56) References Cited

U.S. PATENT DOCUMENTS

2005/0253508 A1   11/2005  Okano
2006/0023130 A1   2/2006   Jeoung et al.
(Continued)

FOREIGN PATENT DOCUMENTS

| CN | 107887339 | 4/2018 |
|---|---|---|
| EP | 2 816 604 | 12/2014 |
| KR | 10-0144932 B1 | 4/1998 |

OTHER PUBLICATIONS

Extended European Search Report corresponding to European Patent Application No. 19204766.0 dated Mar. 13, 2020.

*Primary Examiner* — Moin M Rahman
*Assistant Examiner* — Mohammad A Rahman
(74) *Attorney, Agent, or Firm* — Kile Park Reed & Houtteman PLLC

(57) ABSTRACT

A display apparatus having a display area and a pad area and a method of manufacturing the same, the display apparatus including a base substrate; a thin film transistor on the base substrate in the display area; an insulation layer on the base substrate and the thin film transistor; a conductive pattern layer on the insulation layer, the conductive pattern layer including a pad electrode in the pad area; and a via insulation layer on the insulation layer, exposing an upper surface of the pad electrode, and covering edges of the pad electrode, wherein, in the pad area, the insulation layer includes a groove having a depth, the pad electrode being in the groove.

20 Claims, 29 Drawing Sheets

(58) Field of Classification Search
CPC ......... H01L 2924/13069; H01L 51/0508–057;
H01L 29/04–045; H01L 29/16–1608;
H01L 29/18–185; H01L 29/22–2206;
B32B 2457/206
See application file for complete search history.

(56) References Cited

U.S. PATENT DOCUMENTS

| | | | |
|---|---|---|---|
| 2006/0202615 A1 | 9/2006 | Murakami et al. | |
| 2006/0270122 A1* | 11/2006 | Lee | H01L 51/0021 438/149 |
| 2007/0181218 A1* | 8/2007 | Sakamoto | B23K 35/36 148/25 |
| 2008/0067932 A1* | 3/2008 | Baek | H01L 27/3276 313/509 |
| 2011/0284853 A1 | 11/2011 | Park et al. | |
| 2012/0205142 A1* | 8/2012 | Higo | H05K 1/0242 174/251 |
| 2013/0119388 A1* | 5/2013 | Lee | H01L 51/5265 438/34 |
| 2014/0097415 A1* | 4/2014 | Byun | H01L 51/56 257/40 |
| 2016/0104754 A1* | 4/2016 | You | H01L 27/1255 257/40 |
| 2016/0126494 A1* | 5/2016 | Jung | H01L 27/3246 438/23 |
| 2017/0285390 A1* | 10/2017 | Mun | G02F 1/136227 |
| 2018/0095571 A1* | 4/2018 | Park | H01L 27/323 |
| 2019/0081124 A1 | 3/2019 | Ye et al. | |

* cited by examiner

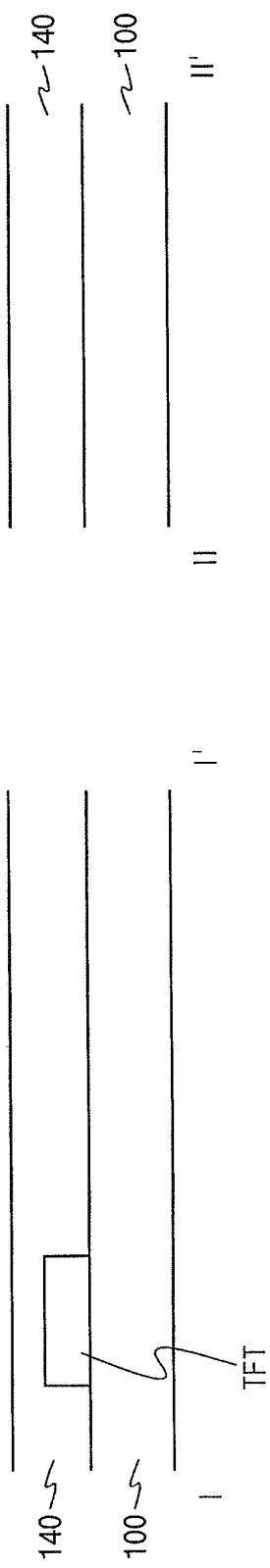

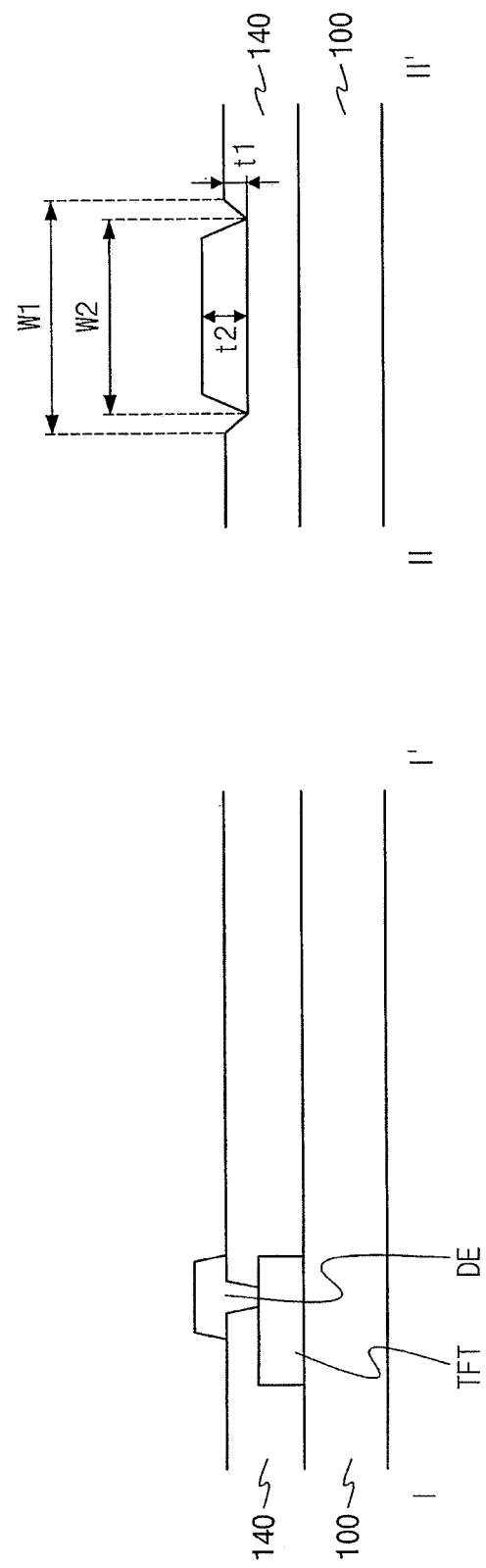

US 11,489,027 B2

DISPLAY APPARATUS AND METHOD OF MANUFACTURING THE SAME

CROSS-REFERENCE TO RELATED APPLICATION

Korean Patent Application No. 10-2018-0127436, filed on Oct. 24, 2018, in the Korean Intellectual Property Office, and entitled: "Display Apparatus and Method of Manufacturing the Same," is incorporated by reference herein in its entirety.

BACKGROUND

1. Field

Embodiments relate to a display apparatus and a method of manufacturing the display apparatus.

2. Description of the Related Art

Recently, a display apparatus having light weight and small size has been manufactured. A cathode ray tube (CRT) display apparatus has been used due to a performance and a competitive price. However, the CRT display apparatus has a drawback with a size or portability. Therefore, a display apparatus such as a plasma display apparatus, a liquid crystal display apparatus, and an organic light emitting display apparatus has been highly regarded due to small size, light weight and low-power-consumption.

SUMMARY

The embodiments may be realized by providing a display apparatus having a display area and a pad area, the display apparatus including a base substrate; a thin film transistor on the base substrate in the display area; an insulation layer on the base substrate and the thin film transistor; a conductive pattern layer on the insulation layer, the conductive pattern layer including a pad electrode in the pad area; and a via insulation layer on the insulation layer, exposing an upper surface of the pad electrode, and covering edges of the pad electrode, wherein, in the pad area, the insulation layer includes a groove having a depth, the pad electrode being in the groove.

A thickness of the conductive pattern layer may be greater and the depth of the groove.

The insulation layer may include an inorganic insulation material.

The via insulation layer may include an organic insulation material.

The via insulation layer may have a first height in the display area and has a second height in the pad area, the second height being smaller than the first height.

The groove may have a first width at an upper surface of on the insulation layer, and the pad electrode may have a second width that is smaller than the first width.

The thin film transistor may include an active pattern on the base substrate; a gate electrode on the active pattern; and a source electrode and a drain electrode included in the conductive pattern layer.

The display apparatus may further include a light emitting structure on the via insulation layer and electrically connected to the drain electrode.

The display apparatus may further include a first gate insulation layer on the insulation layer and the base substrate; and a first gate pattern between the gate insulation layer and the insulation layer, and including a first signal line in the pad area, and wherein a thickness of the insulation layer on the first signal line is smaller than a thickness of the insulation layer adjacent to the first signal line.

An upper surface of the insulation layer on the first signal line may be flat.

The display apparatus may further include a gate insulation layer between the insulation layer and the base substrate, wherein the groove of the insulation layer is an opening through the insulation layer that exposes the gate insulation layer.

A thickness of the via insulation layer in the pad area may be about 0.2 μm to 1.1 μm.

A thickness of the pad electrode may be about 0.2 μm to 1.2 μm.

The insulation layer may include a plurality of layers including different materials.

The display apparatus may further include a conductive film on the pad electrode and including a conductive ball; and a driver on the conductive film, the driver being electrically connected to the pad electrode.

The embodiments may be realized by providing a method of manufacturing a display apparatus having a display area and a pad area, the method including forming an active pattern of a thin film transistor on a base substrate; forming an insulation layer on the active pattern; forming a contact hole and a groove in insulation layer such that the contact hole exposes the active pattern and the groove is in the pad area; forming a conductive pattern layer, the conductive pattern layer including a drain electrode in the contact hole and a pad electrode in the groove; and forming a via insulation layer on the insulation layer such that the via insulation layer exposes the drain electrode and the pad electrode.

The method may further include forming a first electrode on the via insulation layer such that the first electrode is electrically connected to the drain electrode; forming a light emitting layer on the first electrode; and forming a second electrode on the light emitting layer.

The method may further include forming a gate insulation layer on the base substrate prior to forming the insulation layer, wherein the groove is an opening formed through the insulation layer and exposing the gate insulation layer.

The method may further include forming a gate pattern including a gate electrode and a signal line on the base substrate, prior to forming the insulation layer, wherein, in forming the contact hole and the groove, a step of an upper surface of the insulation layer formed on the signal line is removed.

The groove may have a first width at an upper surface of the insulation layer, and the pad electrode may have a second width that is smaller than the first width.

BRIEF DESCRIPTION OF THE DRAWINGS

Features will be apparent to those of skill in the art by describing in detail exemplary embodiments with reference to the attached drawings in which:

FIGS. 9A to 9E illustrate cross-sectional views of stages in a method of manufacturing the display apparatus of FIG. 2;

FIGS. 10A to 10C illustrate cross-sectional views of stages in a method of manufacturing the display apparatus of FIG. 4;

DETAILED DESCRIPTION

Figure 1:
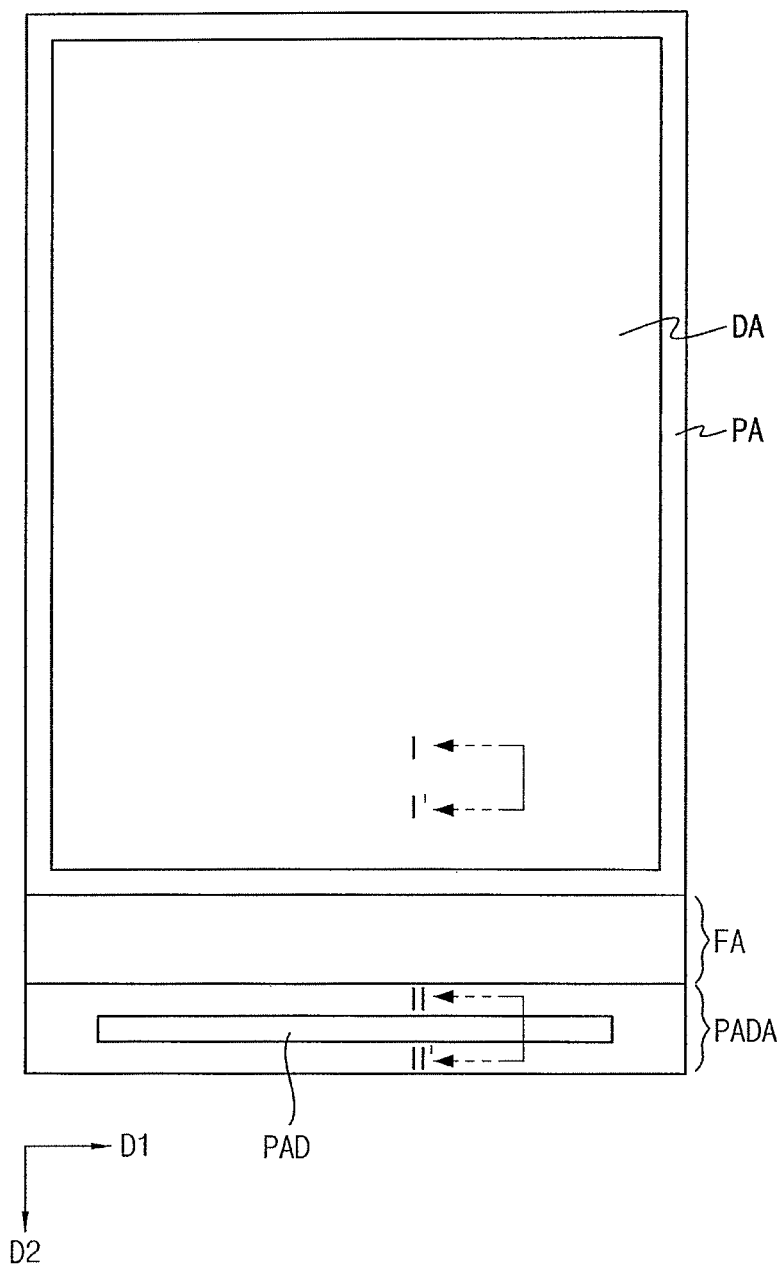
FIG. 1 illustrates a plan view of a display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when an element is referred to as being "between" two elements, it can be the only element between the two elements, or one or more intervening elements may also be present. Like reference numerals refer to like elements throughout.

FIG. 1 illustrates a plan view of a display apparatus according to an exemplary embodiment.

Referring to FIG. 1, the display apparatus may include a display area DA (displaying an image), a peripheral area PA (which is a non-display area adjacent to the display area DA and surrounds the display area DA), a pad region PADA (adjacent to the peripheral area PA), and a folding region FA (between the peripheral region PA and the pad region PADA).

The display area DA may be on a plane formed by a first direction D1 and a second direction D2 perpendicular to the first direction D1. In an implementation, the display area DA may be rectangular. In an implementation display area may have various shapes such as a circular shape, an elliptical shape, a polygonal shape, or a polygonal shape with rounded corners.

In the display area DA, a plurality of pixels may be arranged in a matrix for displaying an image. The display area DA may also include thin film transistors and signal lines therein.

The peripheral area PA is a non-display area and may surround edges of the display area DA while adjacent to the display area DA. A circuit structure for driving the pixels of the display area DA may be in the peripheral area PA.

A pad portion PAD may be in the pad area PADA. The pad portion PAD may include a plurality of pad electrodes (refer to PADE in FIG. 3) for electrically connecting a driving unit (refer to DR in FIG. 3) for applying a driving signal, a voltage, or the like to the display apparatus.

The folding area FA may be a portion where the display apparatus is bent. The display apparatus may include a flexible substrate, and the folding area FA may be bent. For example, the pad area PADA may be at a rear of the display area DA, thereby reducing a bezel width.

Figure 2:
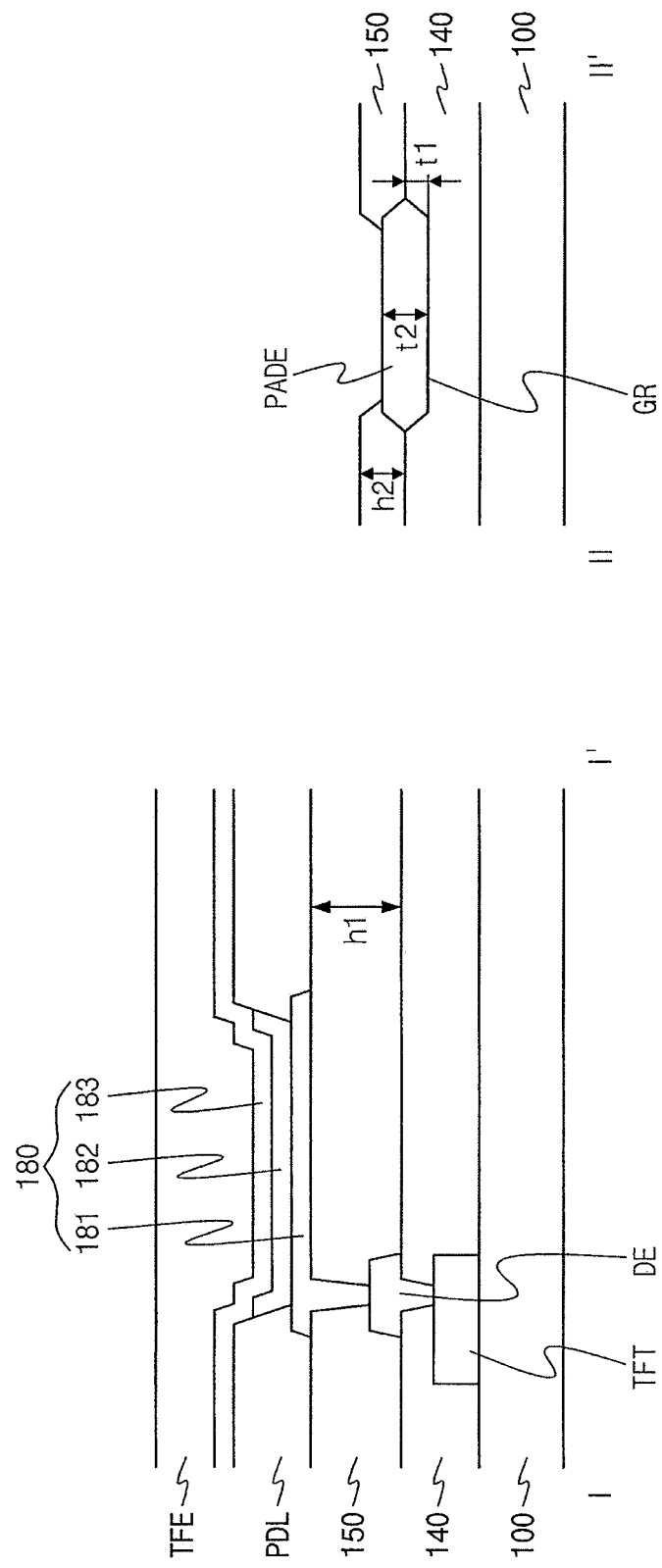
FIG. 2 illustrates cross-sectional views taken along line I-I' and line II-II' of FIG. 1.

FIG. 2 illustrates cross-sectional views taken along line I-I' and line II-II' of FIG. 1. The cross-sectional view taken along the line I-I' is a view of the display area DA of the display apparatus, and the cross-sectional view taken along the line II-II' is a view of the pad area PADA of the display apparatus.

Referring to FIGS. 1 and 2, the display apparatus may include a base substrate 100, a thin film transistor TFT, an insulation layer 140, a conductive pattern layer, a via insulation layer 150, a light emitting structure 180, a pixel defining layer PDL, and a thin film encapsulation layer TFE.

The base substrate 100 may include transparent or opaque insulation materials. In an implementation, the base substrate 100 may include a quartz substrate, a synthetic quartz substrate, a calcium fluoride substrate, a fluoride-doped quartz substrate, a soda lime glass substrate, a non-alkali glass substrate, or the like. In an implementation, the base substrate 100 may include a flexible transparent material such as a flexible transparent resin substrate (e.g., a polyimide substrate). In this case, the polyimide substrate may include a first polyimide layer, a barrier film layer, a second polyimide layer, and the like. For example, the polyimide substrate may have a configuration where the first polyimide layer, the barrier film layer, and the second polyimide layer, are stacked on a rigid glass substrate.

The thin film transistor TFT may be on the base substrate 100 in the display area DA. The thin film transistor TFT may be an amorphous silicon thin film transistor, a poly-Si thin film transistor, an oxide thin film transistor, or the like.

The insulation layer 140 may be on the base substrate 100 on which the thin film transistor TFT is disposed. The insulation layer 140 may sufficiently cover the thin film transistor TFT on the base substrate 100 and may have a substantially flat upper surface without generating a step around the thin film transistor TFT. In an implementation, the insulation layer 140 may cover the thin film transistor TFT on the base substrate 100, and may have substantially the same thickness along the profile of the thin film transistor TFT. The insulation layer 140 may include an inorganic insulating material such as a silicon compound or a metal oxide.

The conductive pattern layer may be on the insulation layer 140. The conductive pattern layer may include a drain electrode DE electrically connected to the thin film transistor TFT in the display area DA and a pad electrode PADE in the pad area PADA. In an implementation, thickness of the pad electrode PADE may be, e.g., 0.2 μm to 1.2 μm.

For example, the drain electrode DE may be electrically connected to an active pattern of the thin film transistor TFT through a contact hole formed through the insulation layer 140.

A groove GR (having a depth t1) may be formed on or in an upper surface of the insulation layer 140. For example, the groove GR may be recessed from the upper surface of the insulation layer 140 by the depth t1. The pad electrode PADE may be in the groove GR. A thickness t2 of the pad electrode PADE may be greater than the depth t1. For example, an upper surface of the pad electrode PADE may protrude from or higher than the upper surface of the insulation layer 140 by a difference of the thickness t2 and the depth t1 from the upper surface of the adjacent insulation layer 140.

The via insulation layer 150 may be on the insulation layer 140 on which the conductive pattern layer is disposed. The via insulation layer 150 may expose (e.g., a central region of) the upper surface of the pad electrode PADE and may cover an edge of the pad electrode PADE. In an implementation, the via insulation layer 150 may have a single-layer structure, or may have a multi-layer structure including at least two insulation layers. The via insulation layer 150 may be formed using an organic material such as a photoresist, an acrylic resin, a polyimide resin, a polyamide resin, a siloxane-based resin, or the like.

The via insulation layer 150 may have a first height h1 (e.g., measured in a direction orthogonal to a surface of the insulation layer 140) in the display area DA and a second height h2 (that is less than the first height h1) in the pad area PADA. For example, the via insulation layer 150 may have a sufficient thickness in the display area DA and a minimum thickness required in the pad area PADA, so that adhesion between the pad electrode PADE and a conductive film (refers to ACF in FIG. 3) may be improved. Maintaining the thickness of the via insulation layer 150 in the pad area PADA sufficiently low may help ensure that the adhesion between the pad electrode PADE and the conductive film is good. Maintaining the thickness of the via insulation layer 150 sufficiently high may help prevent undesirable lifting at the edge of the pad electrode PADE. In an implementation, the second height h2 of the via insulation layer 150 may be 0.2 μm to 1.1 μm.

In an implementation, the via insulation layer 150 may have different thicknesses in the display area DA and the pad area PADA. In an implementation, the thicknesses of the via insulation layer 150 in the display area DA and the pad area PADA may be same.

The light emitting structure 180 may include a first electrode 181, an emission layer 182, and a second electrode 183.

The first electrode 181 may be on the via insulation layer 150. The first electrode 181 may include a reflective material or a transmissive material in accordance with the emission type of the display apparatus. In an implementation, the first electrode 181 may have a single layer structure or a multi layer structure, which may include a metal film, an alloy film, a metal nitride film, a conductive metal oxide film, and/or a transparent conductive film.

The pixel defining layer PDL may be on the via insulation layer 150 on which the first electrode 181 is disposed. The pixel defining layer PDL may be formed using an organic material. For example, the pixel defining layer PDL may include a photoresist, an acryl resin, a polyimide resin, a polyamide resin, a siloxane resin, or the like. In an implementation, an opening that exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to an emitting area, and a non-emitting area may correspond to a portion adjacent to the opening of the pixel defining layer PDL.

The light emitting layer 182 may be on the first electrode 181 exposed through the opening of the pixel defining layer PDL. In an implementation, the light emitting layer 182 may extend on a sidewall of the opening of the pixel defining layer PDL. In an implementation, the light emitting layer 182 may include an organic light emitting layer (EL), a hole injection layer (HIL), a hole transfer layer (HTL), an electron transfer layer (ETL), an electron injection layer (EIL), or the like. In an implementation, the hole injection layer, the hole transport layer, the electron transport layer, and the electron injection layer (e.g., layers other than the organic emission layer) may be formed in common to correspond to a plurality of pixels. In an implementation, a plurality of organic light emitting layers may be formed using light emitting materials for generating different colors of light such as a red light, a green light and a blue light in accordance with color pixels of the display device. In an implementation, the organic light emitting layer of the of the light emitting layer 182 may include a plurality of stacked light emitting materials for generating a red light, a green light and a blue light to thereby emitting a white light. For example, elements of the light emitting layer 182 may be commonly formed so as to correspond to a plurality of pixels, and each pixel may be divided by a color filter layer.

The second electrode 183 may be on the pixel defining layer PDL and the light emitting layer 182. The second electrode 183 may include a transmissive material or a reflective material in accordance with the emission type of the display device. In an implementation, the second electrode 183 may also have a single layer structure or a multi layer structure, which may include a metal film, an alloy film, a metal nitride film, a conductive metal oxide film and/or a transparent conductive film.

The thin film encapsulation layer TFE may be on the second electrode 183. The thin film encapsulation layer TFE may help prevent penetration of moisture and oxygen from outside. The thin film encapsulation layer TFE may include at least one organic layer and at least one inorganic layer. The at least one organic layer and the at least one inorganic layer may be alternately stacked with each other. In an implementation, the thin film encapsulation layer TFE may include two inorganic layers and one organic layer therebetween. In an implementation, it is possible to provide a sealing substrate for shielding outside air and moisture from penetrating into the display apparatus instead of the thin film encapsulation layer TFE.

Figure 3:
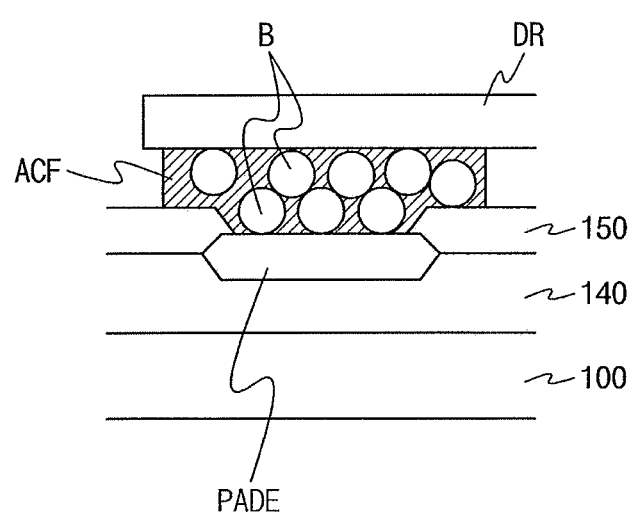
FIG. 3 illustrates a cross-sectional view of a state in which a driving unit is connected to a pad electrode of the display apparatus of FIG. 1 by a conductive film.

FIG. 3 illustrates a cross-sectional view of a state in which a driving unit is connected to a pad electrode of the display apparatus of FIG. 1 by a conductive film.

Referring to FIGS. 1 to 3, a conductive film ACF may be on the pad electrode PADE and the via insulation layer 150 of the display apparatus. The conductive film ACF may be an anisotropic conductive film including conductive balls B.

A driving unit or driver DR electrically connected to the pad electrode PADE may be on the conductive film ACF. The driving unit DR may be electrically connected to the pad electrode PADE through the conductive balls B of the conductive film ACF. The driving unit DR may apply a driving signal, a voltage, or the like to the display apparatus through the pad electrode PADE.

The pad electrode PADE may be in the groove GR of the insulation layer 140 (as compared with the case where the groove GR is not formed), and a step between the upper surface of the insulation layer 140 and the upper surface of the pad electrode PADE may be reduced. For example, it is possible to help prevent breakage of the via insulation layer 150 due to the step difference, while forming the pad electrode PADE sufficiently thick.

In addition, the thickness of the via insulation layer 150 around the pad electrode PADE may be thinner than the thickness thereof in the display area DA, and adhesion of the conductive film ACF to the pad electrode PADE may be improved.

Figure 4:
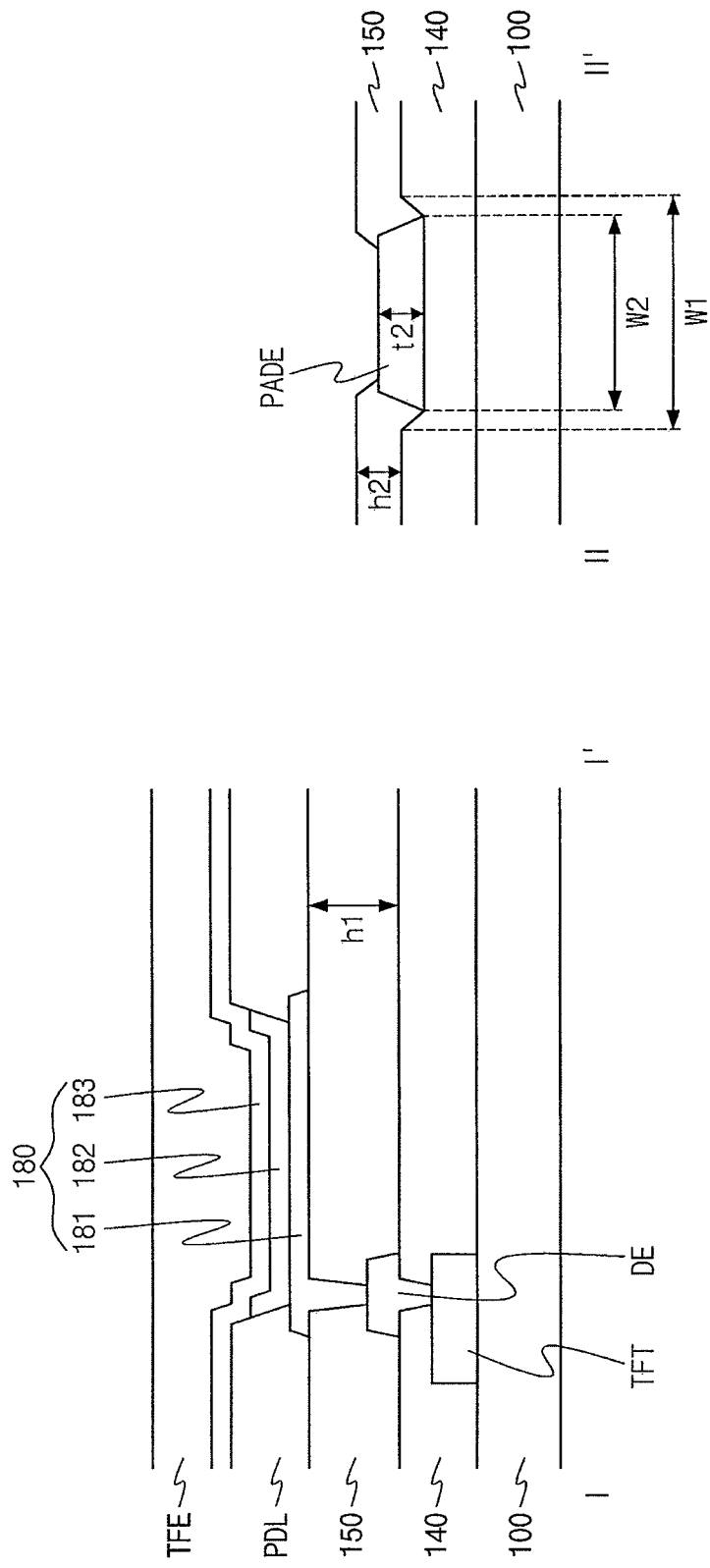
FIG. 4 illustrates a cross-sectional view of a pad area and a display area of a display apparatus according to an exemplary embodiment.

FIG. 4 illustrates a cross-sectional view of a pad area and a display area of a display apparatus according to an exemplary embodiment.

Referring to FIGS. 1 and 4, the display apparatus may be substantially the same as the display apparatus of FIG. 2 except for a pad electrode PADE. Therefore, repeated explanation may be omitted.

The display apparatus may include a base substrate 100, a thin film transistor TFT, an insulation layer 140, a conductive pattern layer (including a drain electrode DE and a pad electrode PADE), a via insulation layer 150, a light emitting structure 180, a pixel defining layer PDL, and a thin film encapsulation layer TFE.

A groove having a depth may be formed on or in an upper surface of the insulation layer 140. For example, the groove may be recessed from the upper surface of the insulation layer 140. The pad electrode PADE may be in the groove. A thickness t2 of the pad electrode PADE may be greater than the depth of the groove.

The groove may have a first width W1 as measured at the upper surface of the insulation layer 140. The pad electrode PADE may have a second width W2 that is smaller than the first width W1. For example, the pad electrode PADE may be in the groove.

In an implementation, a width of a lower or bottom surface of the groove and the second width W2 may be equal to each other. In an implementation, the second width W2 may be smaller than the first width W1 and larger than the width of the bottom surface of the groove, so that a side surface of the pad electrode PADE may be formed on a side surface (e.g., sidewall) of the groove.

Figure 5:
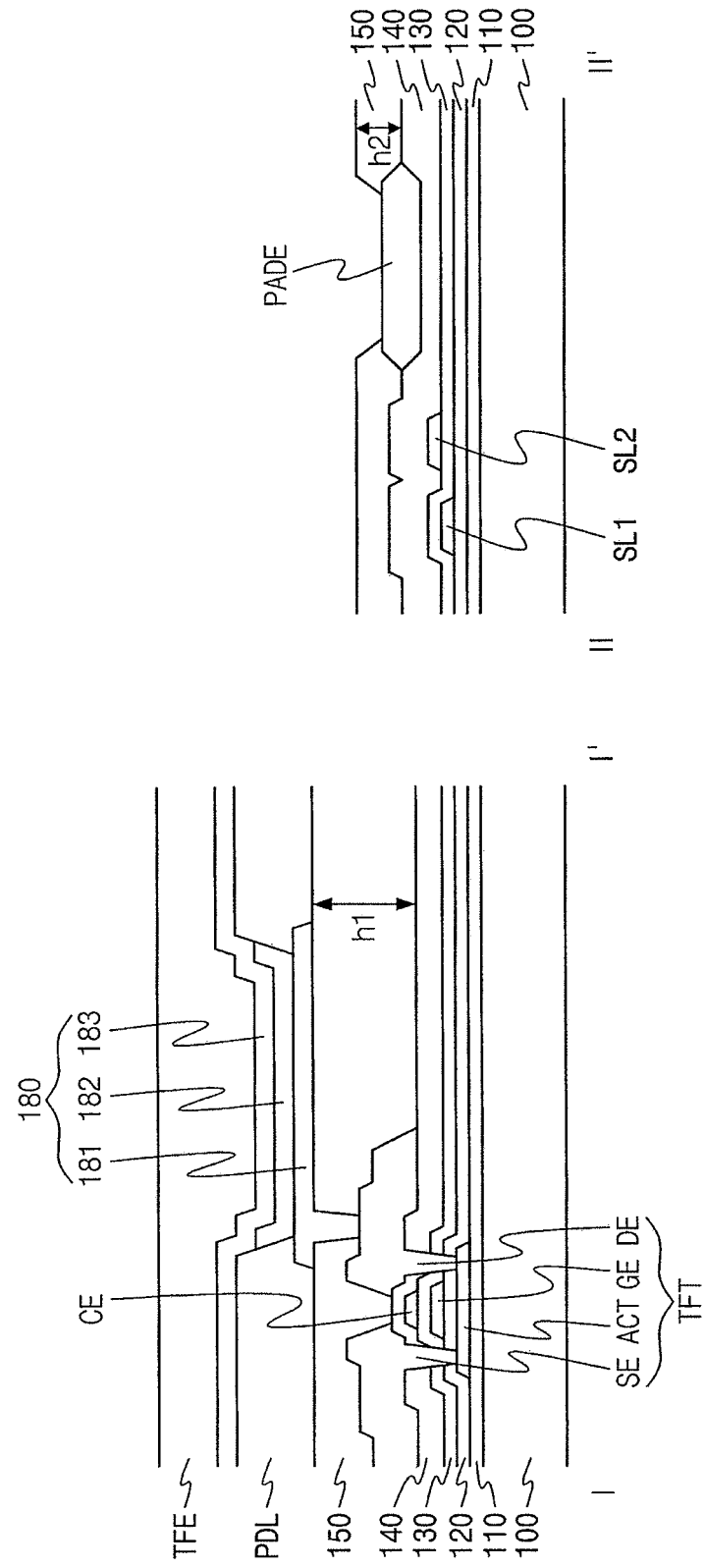
FIG. 5 illustrates a cross-sectional view of a pad area and a display area of a display apparatus according to an exemplary embodiment.

FIG. 5 illustrates a cross-sectional view of a pad area and a display area of a display apparatus according to an exemplary embodiment.

Referring to FIGS. 1 and 5, the display apparatus may include a base substrate 100, a buffer layer 110, an active pattern ACT, a gate insulation layer 120, a first gate pattern, a first insulation layer 130, a second gate pattern, a second insulation layer 140, a conductive pattern layer, a via insulation layer 150, a light emitting structure 180, a pixel defining layer PDL, and a thin film encapsulation layer TFE.

In an implementation, the base substrate 100 may be made of a transparent or opaque material. In an implementation, the base substrate 100 may be made of a transparent resin substrate having flexibility.

The buffer layer 110 may be entirely on the base substrate 100 (e.g., in the display area DA and the pad area PADA). The buffer layer 110 may include an inorganic insulating material such as silicon oxide (SiOx), silicon nitride (SiNx), or the like.

The active pattern ACT may be on the buffer layer 110 in the display area DA. The active pattern ACT may include polycrystalline silicon. The active pattern ACT may include drain and source regions doped with an impurity and a channel region between the drain region and the source region.

The gate insulation layer 120 may cover the active pattern ACT on the buffer layer 110, and may have a substantially uniform thickness along a profile of the active pattern ACT. The gate insulation layer 120 may include an inorganic insulating material such as a silicon compound or a metal oxide.

The first gate pattern may be on the gate insulation layer 120. The first gate pattern may include a signal line such as a gate electrode GE and a gate line overlapping the active pattern ACT. The first gate pattern may further include a first signal line SL1 in the pad area PADA. The first gate pattern may be formed using a metal, an alloy, a metal nitride, a conductive metal oxide, a transparent conductive material, or the like.

The first insulation layer 130 may be on the gate insulation layer 120 on which the first gate pattern is disposed. The first insulation layer 130 may cover the first gate pattern on the gate insulation layer 120, and may have a substantially uniform thickness along a profile of the first gate pattern. The first insulation layer 130 may include an inorganic insulating material such as a silicon compound or a metal oxide.

The second gate pattern may be on the first insulation layer 130. The second gate pattern may include a storage electrode CE. The storage electrode CE may overlap with the gate electrode GE to form a storage capacitor. The second gate pattern may further include a second signal line SL2 in the pad area PADA. The second signal line SL2 may be adjacent to the first signal line SL1. The second gate pattern may be formed using a metal, an alloy, a metal nitride, a conductive metal oxide, a transparent conductive material, or the like.

The second insulation layer 140 may be on the first insulation layer 130 on which the second gate pattern is disposed. The second insulation layer 140 may cover the second gate pattern on the first insulation layer 130, and may have a substantially uniform thickness along a profile of the second gate pattern. The second insulation layer 140 may include an inorganic insulating material such as a silicon compound or a metal oxide.

The conductive pattern layer may be on the second insulation layer 140. The conductive pattern layer may include a source electrode SE, a drain electrode DE, and a pad electrode PADE on the pad area PADA. The conductive pattern layer may be formed using a metal, an alloy, a metal nitride, a conductive metal oxide, a transparent conductive material, or the like.

The source electrode SE and the drain electrode DE may be electrically connected to the active pattern ACT through a contact hole formed through the second insulation layer 140, the first insulation layer 130, and the gate insulation layer 120.

A groove having a depth may be formed on or at an upper surface of the second insulation layer 140. For example, the groove may be recessed inwardly from the upper surface of the second insulation layer 140 by the depth. The pad electrode PADE may be in the groove. A thickness of the pad electrode PADE may be greater than the depth of the groove.

The via insulation layer 150 may be on the second insulation layer 140 on which the conductive pattern layer is disposed. The via insulation layer 150 may have a first height h1 in the display area DA and a second height h2 that is less than the first height h1 in the pad area PADA.

In an implementation, the second insulation layer 140 may include a silicon nitride (SiNx) layer and a silicon oxide (SiOx) layer, and may have a thickness of about 0.5 μm. In an implementation, the pad electrode PADE may have a thickness of about 0.7 μm. In an implementation, a step difference between the upper surface of the second insulating layer 140 and an upper surface of the pad electrode PADE may be about 0.2 μm. When the second height h2 of the via insulating layer 150 is about 0.2 μm to 1.1 μm, a stress applied to the via insulation layer 150 may be reduced by the step difference, as compared with the case where the groove is not formed. For example, the via insulation layer 150 around the pad electrode PADE may not break or float.

The light emitting structure 180 may include a first electrode 181, a light emitting layer 182, and a second electrode 183. The first electrode 181 may be on the via insulation layer 150. The pixel defining layer PDL may be on the via insulation layer 150 on which the first electrode 181 is disposed. The light emitting layer 182 may be on the first electrode 181 exposed through an opening of the pixel defining layer PDL. The second electrode 183 may be on the pixel defining layer PDL and the light emitting layer 182. The thin film encapsulation layer TFE may be on the second electrode 183.

Figure 6:
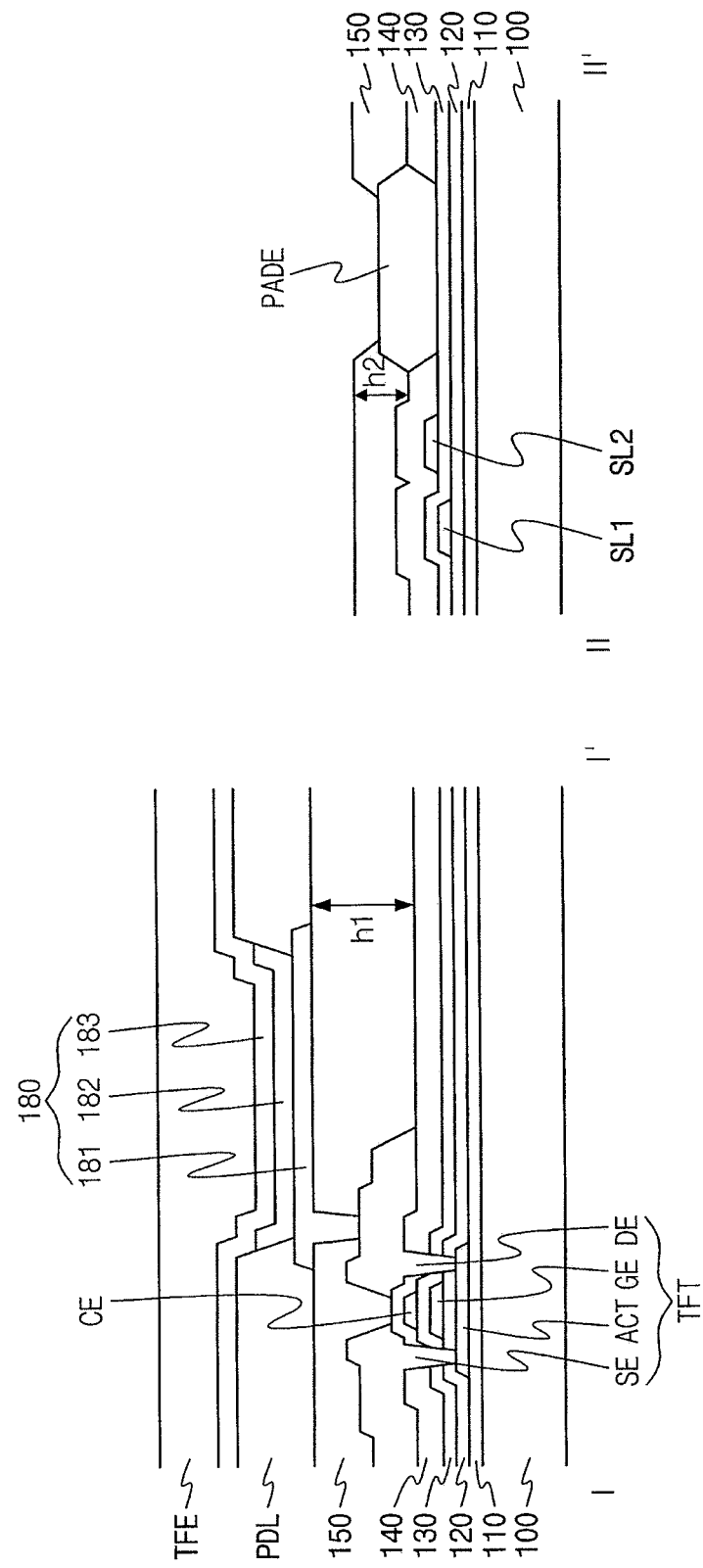
FIG. 6 illustrates a cross-sectional view of a pad area and a display area of a display apparatus according to an exemplary embodiment.

Here, the via insulation layer 150, the light emitting structure 180, the pixel defining layer PDL, and the thin film encapsulation layer TFE may be substantially the same as those of the display apparatus of FIG. 2. Therefore, the repeated explanation may be omitted FIG. 6 illustrates a cross-sectional view of a pad area and a display area of a display apparatus according to an exemplary embodiment.

Referring to FIGS. 1 to 6, the display apparatus is substantially the same as the display apparatus of FIG. 5 except that an opening may be formed in (e.g., completely through) a second insulation layer 140, instead of a groove (e.g., which only partially penetrates the layer), and a pad electrode PADE may be in the opening. Therefore, repeated description may be omitted.

The display apparatus may include a base substrate 100, a buffer layer 110, an active pattern ACT, a gate insulation layer 120, a first gate pattern including a gate electrode GE and a first signal line SL1, a first insulation layer 130, a second gate pattern including a storage electrode CE and a second signal line SL2, a second insulation layer 140, a conductive pattern layer including source and drain electrodes and a pad electrode PADE, a via insulation layer 150, a light emitting structure 180, a pixel defining layer PDL, and a thin film encapsulation layer TFE.

An opening to expose the first insulation layer 130 through the second insulation layer 140 may be formed in the pad area PADA. The pad electrode PADE may be in the opening. The pad electrode PADE may be in the opening formed through the second insulation layer 140, and an upper surface of the pad electrode PADE may protrude from or higher than an upper surface of the adjacent insulation layer 140 by only a difference between a thickness of the pad electrode PADE and a thickness of the insulation layer 140, to form a step. For example, it is possible to prevent breakage of the via insulating layer 150, such as lifting.

Figure 7:
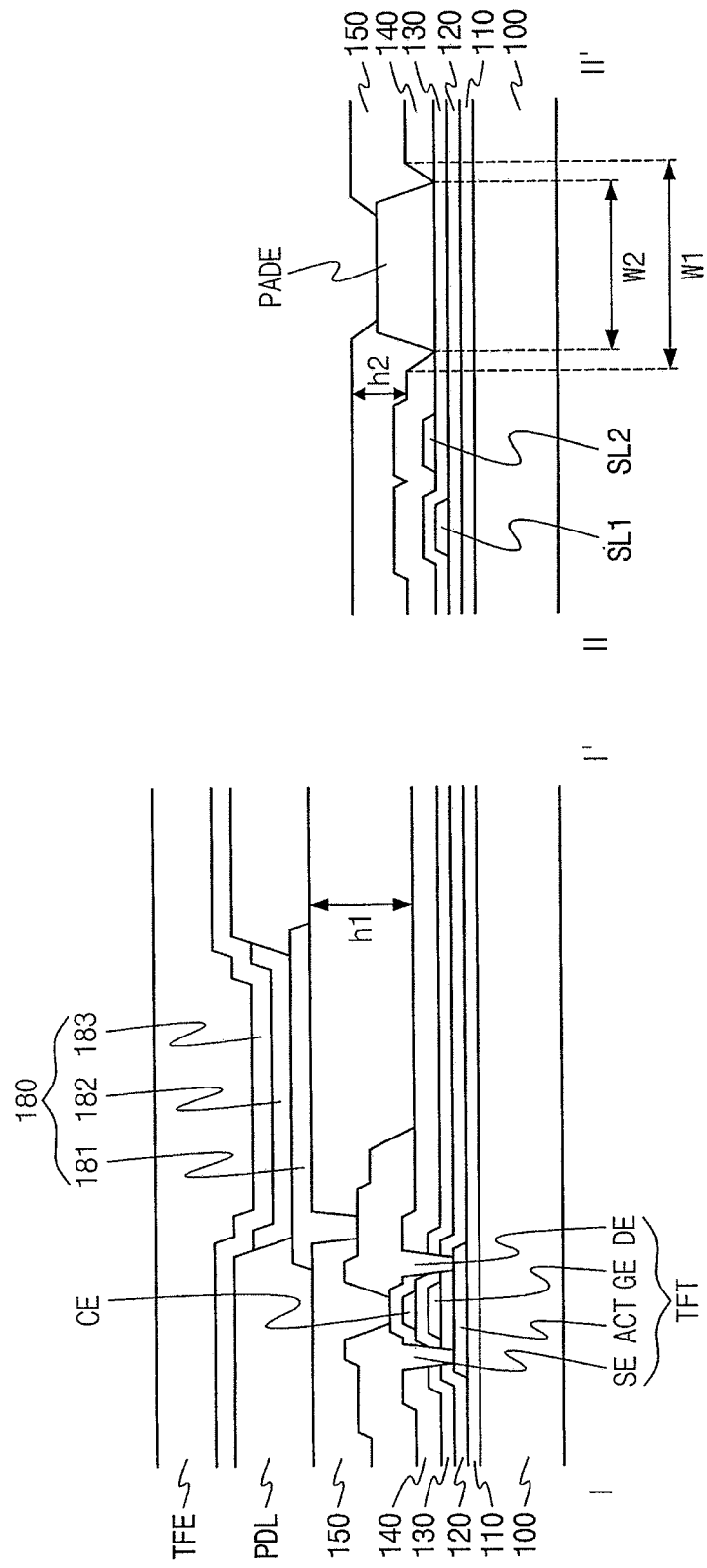
FIG. 7 illustrates a cross-sectional view of a pad area and a display area of a display apparatus according to an exemplary embodiment.

FIG. 7 illustrates a cross-sectional view of a pad area and a display area of a display apparatus according to an exemplary embodiment.

Referring to FIGS. 1 to 7, the display apparatus may be substantially the same as the display apparatus of FIG. 6 except for the pad electrode PADE. Therefore, repeated explanation may be omitted.

The display apparatus may include a base substrate 100, a buffer layer 110, an active pattern ACT, a gate insulation layer 120, a first gate pattern including a gate electrode GE and a first signal line SL1, a first insulation layer 130, a second gate pattern including a storage electrode CE and a second signal line SL2, a second insulation layer 140, a conductive pattern layer including source and drain electrodes and a pad electrode PADE, a via insulation layer 150, a light emitting structure 180, a pixel defining layer PDL, and a thin film encapsulation layer TFE.

An opening to expose the first insulation layer 130 through the second insulation layer 140 may be formed in the pad area PADA. The pad electrode PADE may be in the opening.

The opening may have a first width W1 as measured at an upper surface of the insulation layer 140, and the pad electrode PADE may have a second width W2 that is smaller than the first width W1. For example, the pad electrode PADE may be in the opening.

In an implementation, a width of a lower surface of the opening, e.g., a width of the exposed upper surface of the first insulation layer 130 and the second width W2 may be the same. In an implementation, the second width W2 may be smaller than the first width W1 and larger than the lower surface of the opening, so that a side surface of the pad electrode PADE may be on a side surface (e.g., sidewall) of the opening.

Figure 8:
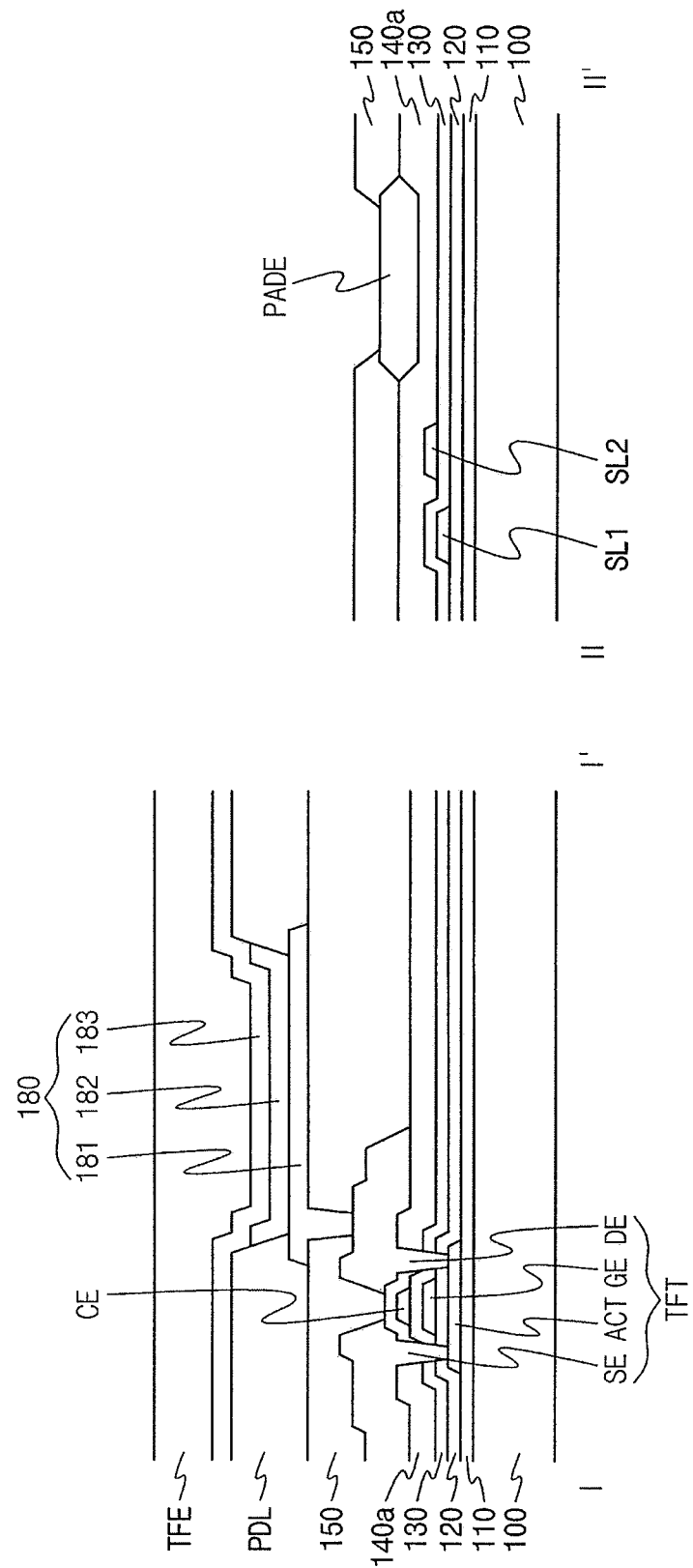
FIG. 8 illustrates a cross-sectional view of a pad area and a display area of a display apparatus according to an exemplary embodiment.

FIG. 8 illustrates a cross-sectional view of a pad area and a display area of a display apparatus according to an exemplary embodiment.

Referring to FIGS. 1 and 8, the display apparatus may be substantially the same as the display apparatus of FIG. 5 except that an upper surface of the second insulation layer 140a on first and second signal lines SL1 and SL2 is flat. Therefore, repeated explanations may be omitted.

The display apparatus may include a base substrate 100, a buffer layer 110, an active pattern ACT, a gate insulation layer 120, a first gate pattern including a gate electrode GE and a first signal line SL1, a first insulation layer 130, a second gate pattern including a storage electrode CE and a second signal line SL2, a second insulation layer 140a, a conductive pattern layer including source and drain electrodes and a pad electrode PADE, a via insulation layer 150, a light emitting structure 180, a pixel defining layer PDL, and a thin film encapsulation layer TFE.

The second insulation layer 140a may have a substantially uniform thickness along a profile of a structure below the second insulating layer 140a. For example, an upper surface of the second insulating layer 140a may not be flat, and a step may be formed in the display area DA.

The second insulation layer 140a may have a flat upper surface on the first and second signal lines SL1 and SL2 in the pad area PADA. For example, a thickness of the second insulating layer 140a on the first and second signal lines SL1 and SL2 may be smaller than a thickness of the insulating layer 140a adjacent to the first and second signal lines SL1 and SL2. Steps on the second insulating layer 140a by the first and second signal lines SL1 and SL2 may not be formed in the pad area PADA, and it is possible to help prevent breakage or lifting of the via insulation layer 140 (which could otherwise occur due to the steps).

FIGS. 9A to 9E illustrate cross-sectional views of stages in a method of manufacturing the display apparatus of FIG. 2.

Referring to FIG. 9A, a thin film transistor TFT may be formed on the base substrate 100. An insulation layer 140 may be formed on the base substrate 100 on which the thin film transistor TFT is formed. The insulation layer 140 may be formed by a chemical vapor deposition process, a spin coating process, a plasma enhanced chemical vapor deposition process, a sputtering process, a vacuum deposition process, a high density plasma-chemical vapor deposition process, a printing process, or the like.

Figure 9B:
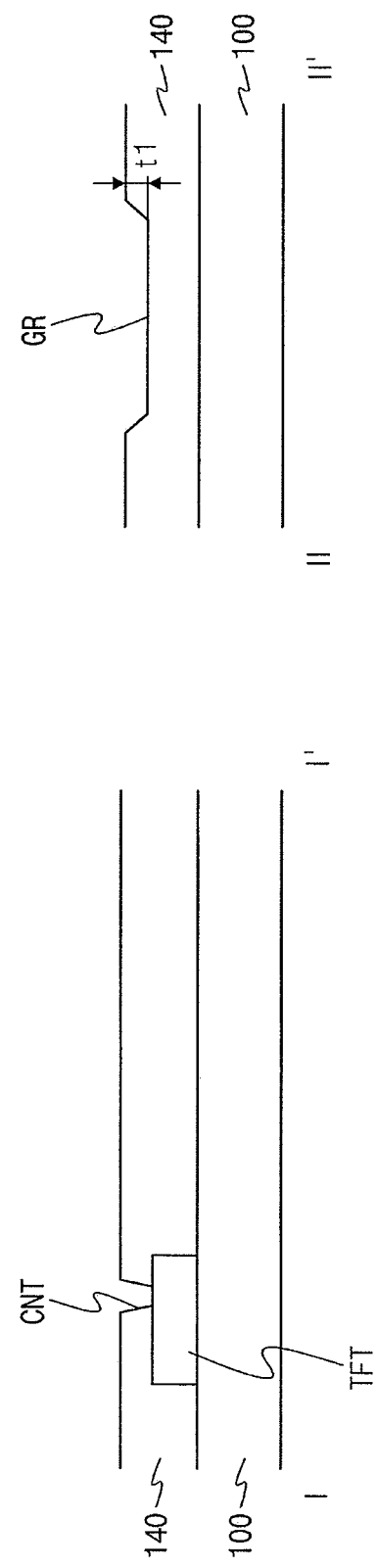

Referring to FIG. 9B, the insulation layer 140 may be partially removed to form a contact hole CNT (exposing the thin film transistor TFT) and a groove GR (in the pad area). The groove GR may have a depth t1. For example, after forming a photoresist layer on the insulation layer 140, the photoresist layer may be exposed and developed using a mask having a pattern corresponding to the contact hole CNT and the groove GR to form a photoresist pattern. The insulation layer 140 may be etched using the photoresist pattern to form the contact hole CNT and the groove GR. In an implementation, size and depth of the groove GR and the contact hole CNT may be adjusted to a desired degree by using a halftone mask or the like.

Figure 9C:
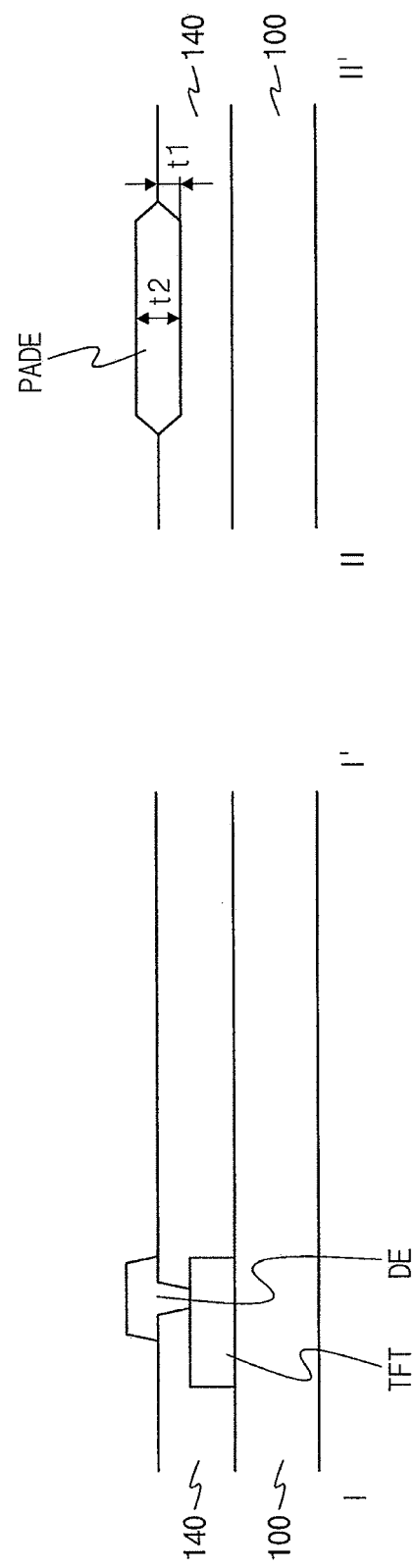

Referring to FIG. 9C, a conductive pattern layer (including a drain electrode DE and a pad electrode PADE) may be formed on the insulation layer 140. The conductive layer may be formed on the insulation layer 140 by patterning the conductive layer using a photolithography process or an etching process using an additional etching mask. In an implementation, the conductive layer may be formed using a printing process, a sputtering process, a chemical vapor deposition process, a pulsed laser deposition (PLD) process, a vacuum deposition process, an atomic layer deposition (ALD) process, etc.

In an implementation, the conductive pattern layer may have a thickness t2, and the thickness t2 may be larger than the depth t1 of the groove GR.

Figure 9D:
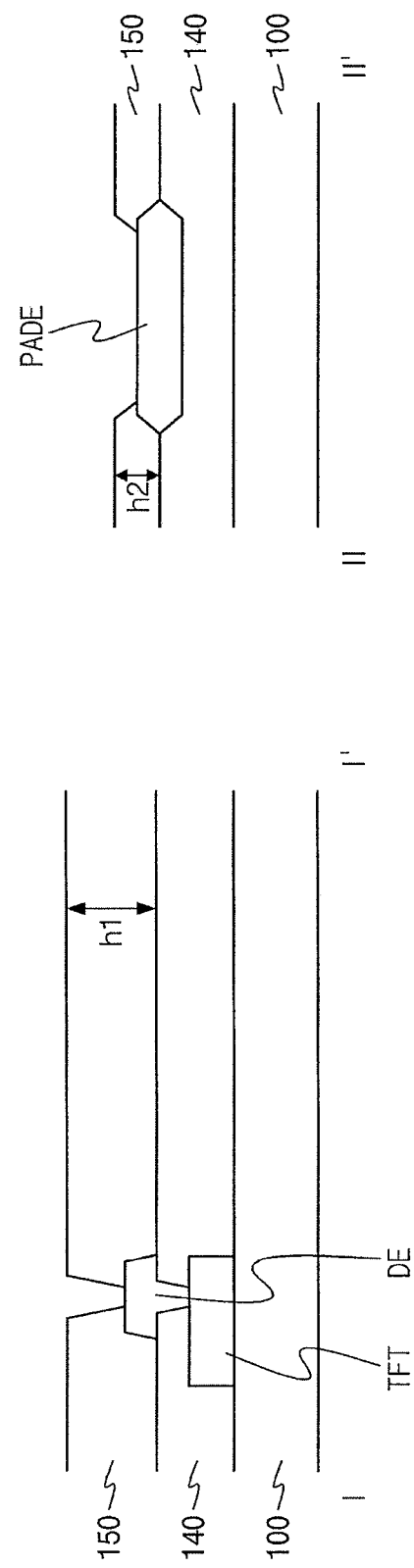

Referring to FIG. 9D, a via insulation layer 150 may be formed on the insulation layer 140 on which the conductive pattern layer is formed. The via insulation layer 150 may be formed by forming a photoresist layer on the insulation layer 140, and then exposing and developing the photoresist layer. In an implementation, by using a halftone mask or the like, the via insulation layer 150 may have a second height h2 (in the pad area) that is less than a first height h1 (in the display area), and may expose the pad electrode PADE and the drain electrode DE.

Figure 9E:
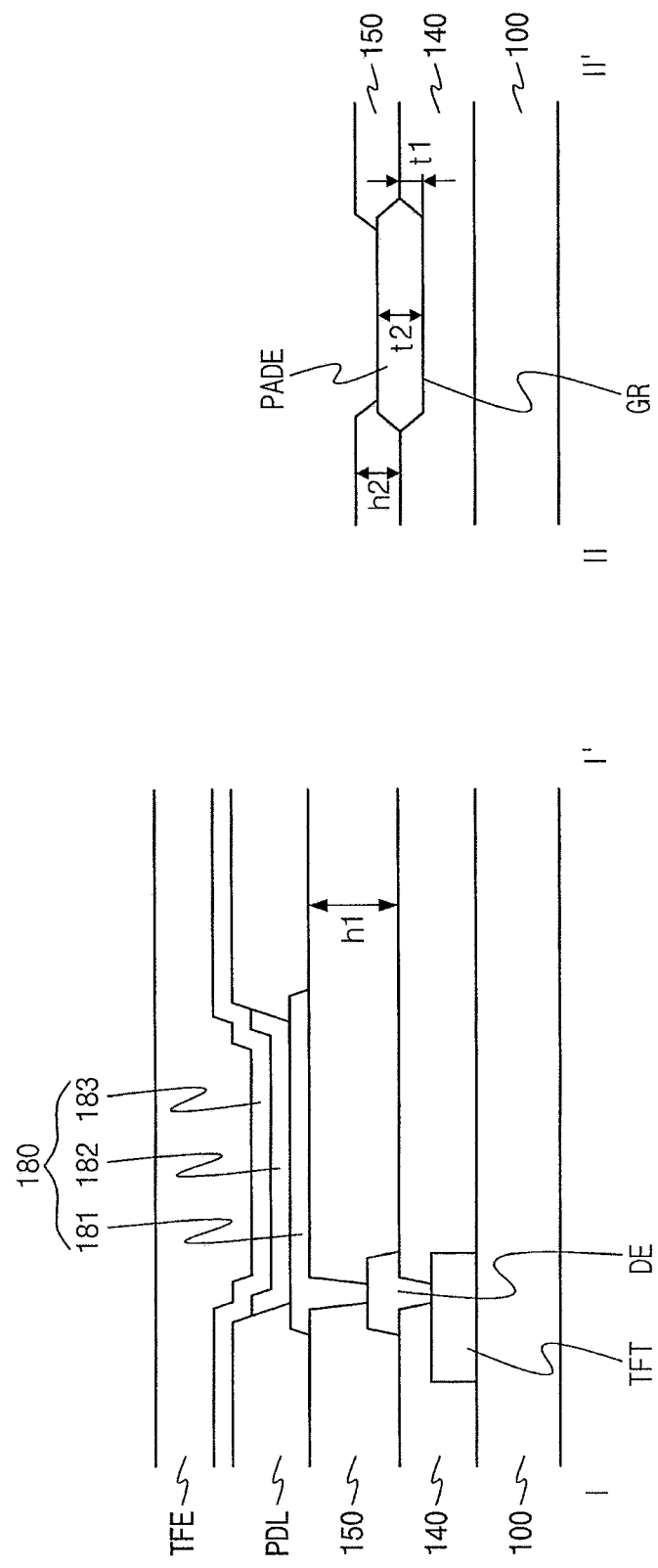

Referring to FIG. 9E, a first electrode 181, a pixel defining layer PDL, a light emitting layer 182, a second electrode 183 and a thin film encapsulation layer TFE may be formed on the via insulation layer 150 to manufacture the display apparatus. The first electrode 181, the pixel defining layer PDL, the light emitting layer 182, the second electrode 183 and the thin film encapsulation layer TFE may be formed through suitable methods.

In an implementation, a conductive film and a driver may be attached to the exposed upper surface of the pad electrode PADE. (refers to FIG. 3)

Figure 10A:
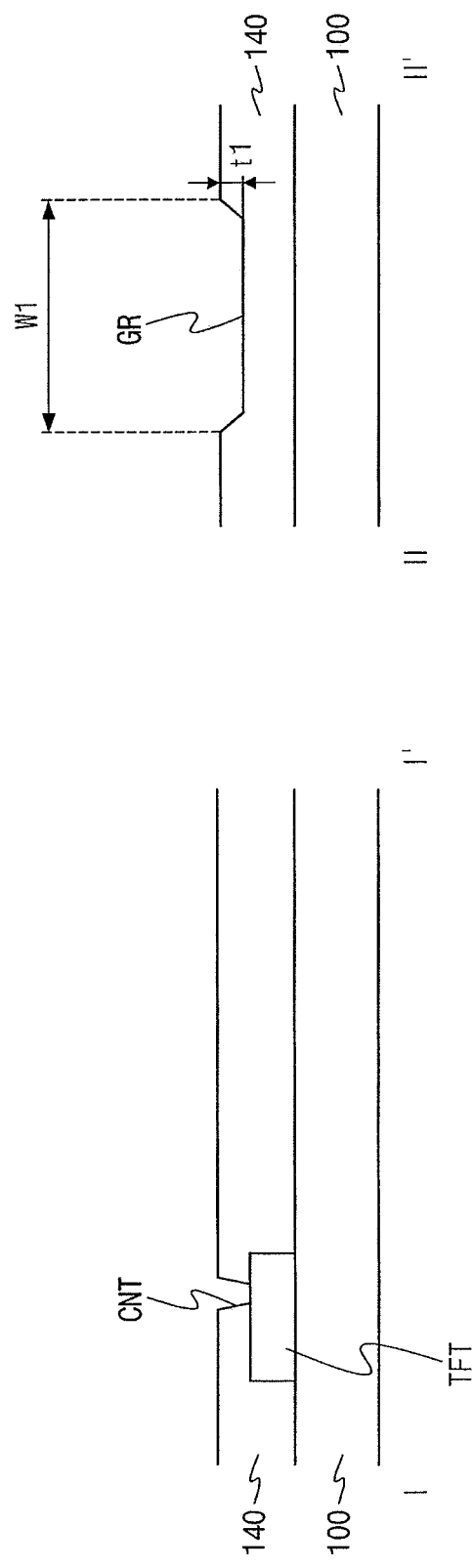
Figure 10C:
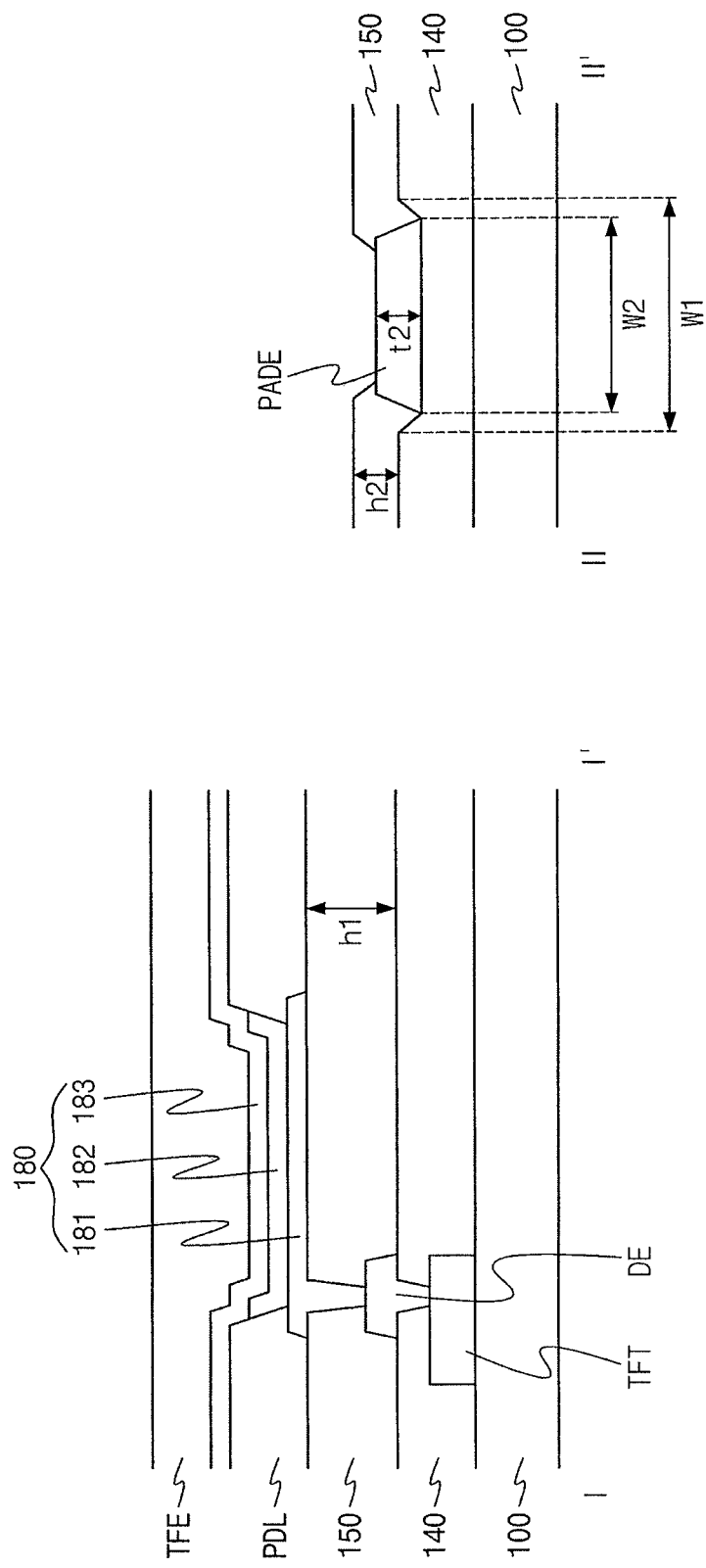

FIGS. 10A to 10C illustrate cross-sectional views of stages in a method of manufacturing the display apparatus of FIG. 4.

Referring to FIG. 10A, a thin film transistor TFT may be formed on the base substrate 100. An insulation layer 140 may be formed on the base substrate 100 on which the thin film transistor TFT is formed. The insulation layer 140 may be partially removed to form a contact hole CNT exposing the thin film transistor TFT and a groove GR in the pad area. The groove GR may have a depth t1. The groove GR may have a first width W1 on the upper surface of the insulation layer 140.

Referring to FIG. 10B, a conductive pattern layer (including a drain electrode DE and a pad electrode PADE) may be formed on the insulation layer 140. In an implementation, the pad electrode PADE may be in the groove GR, and the pad electrode PADE may have a second width W2 that is smaller than the first width W1. For example, a width of the lower surface of the pad electrode PADE may be smaller than a width of the upper surface of the groove GR (e.g., a width of the groove GR at the upper surface of the insulation layer 140).

Referring to FIG. 10C, a first electrode 181, a pixel defining layer PDL, a light emitting layer 182, a second electrode 183, and a thin film encapsulation layer TFE 182 may be formed on the insulation layer 140 (on which the conductive pattern layer is formed) to manufacture the display apparatus. The via insulation layer 150, the first electrode 181, the pixel defining layer PDL, the light emitting layer 182, the second electrode 183 and the thin film encapsulation layer TFE may be formed through suitable methods.

FIGS. 11A to 11D illustrate cross-sectional views of stages in a method of manufacturing the display apparatus of FIG. 5.

Figure 11A:
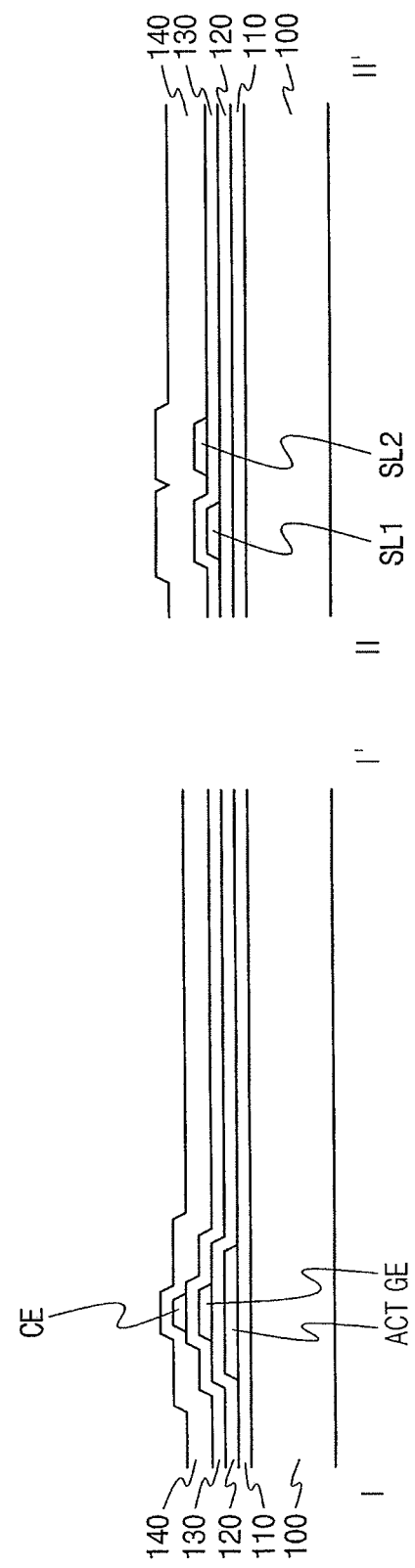
FIGS. 11A to 11D illustrate cross-sectional views of stages in a method of manufacturing the display apparatus of FIG. 5.

Referring to FIG. 11A, a buffer layer 110 may be formed on a base substrate 100. An active pattern ACT may be formed on the buffer layer 110. A gate insulation layer 120 may be formed on the base substrate 100 on which the active pattern ACT is formed. A first gate pattern including a gate electrode GE and a first signal line SL1 may be formed on the gate insulation layer 120. The first insulation layer 130 may be formed on the gate insulation layer 120 on which the first gate pattern is formed. A second gate pattern including a storage electrode CE and a second signal line SL2 may be formed on the first insulation layer 130. The second insulation layer 140 may be formed on the first insulation layer 130 on which the second gate pattern is formed.

Figure 11B:
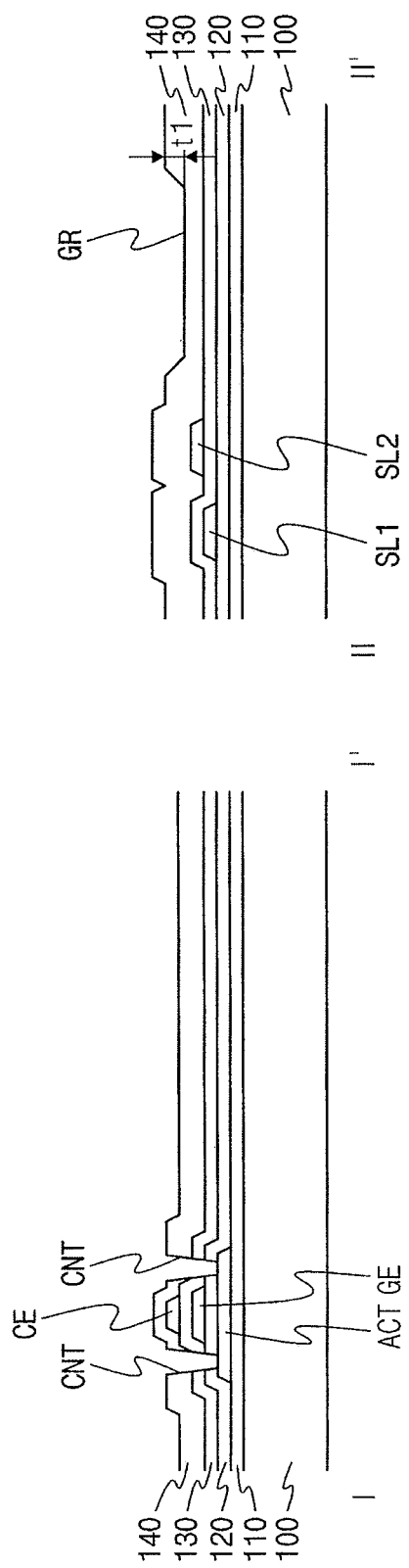

Referring to FIG. 11B, the second insulation layer 140 may be partially removed to form a contact hole CNT (exposing the thin film transistor TFT) and a groove GR. The groove GR may have a depth.

Figure 11C:
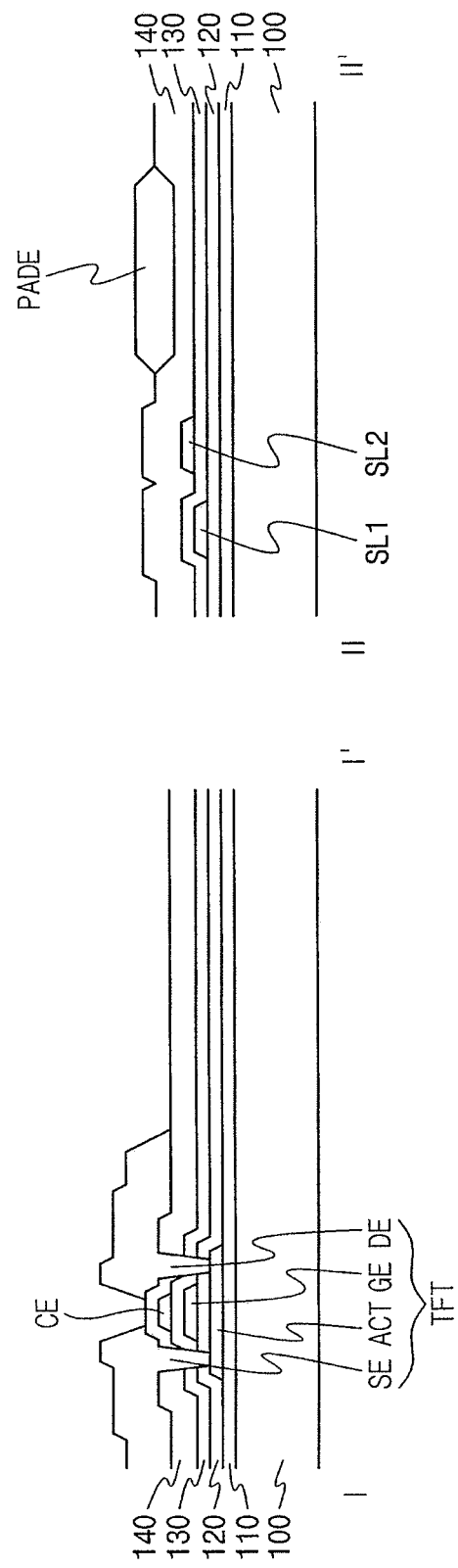

Referring to FIG. 11C, a conductive pattern layer (including a drain electrode DE and a pad electrode PADE) may be formed on the insulation layer 140. A conductive layer may be formed on the insulation layer 140, and then the conductive layer may be patterned into the conductive pattern using a photolithography process or an etching process using an additional etching mask.

Figure 11D:
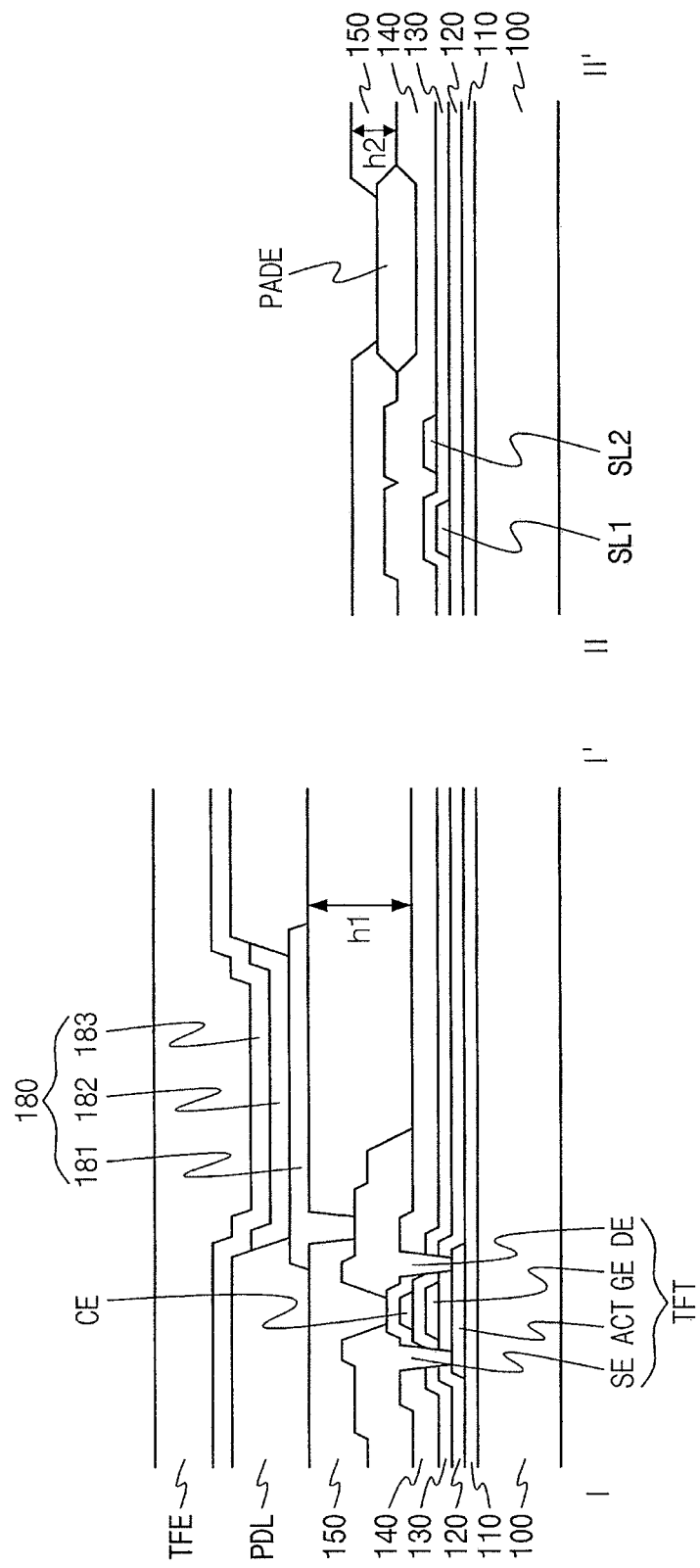

Referring to FIG. 11D, a via insulation layer 150, a first electrode 181, a pixel defining layer PDL, a light emitting layer 182, a second electrode 183, and a thin film encapsulation layer TFE 182 may be formed on the insulation layer 140 on which the conductive pattern layer is formed, whereby the display apparatus can be manufactured. The via insulation layer 150, the first electrode 181, the pixel defining layer PDL, the light emitting layer 182, the second electrode 183 and the thin film encapsulation layer TFE may be formed through suitable methods.

FIGS. 12A to 12D illustrate cross-sectional views of stages in a method of manufacturing the display apparatus of FIG. 6.

Figure 12A:
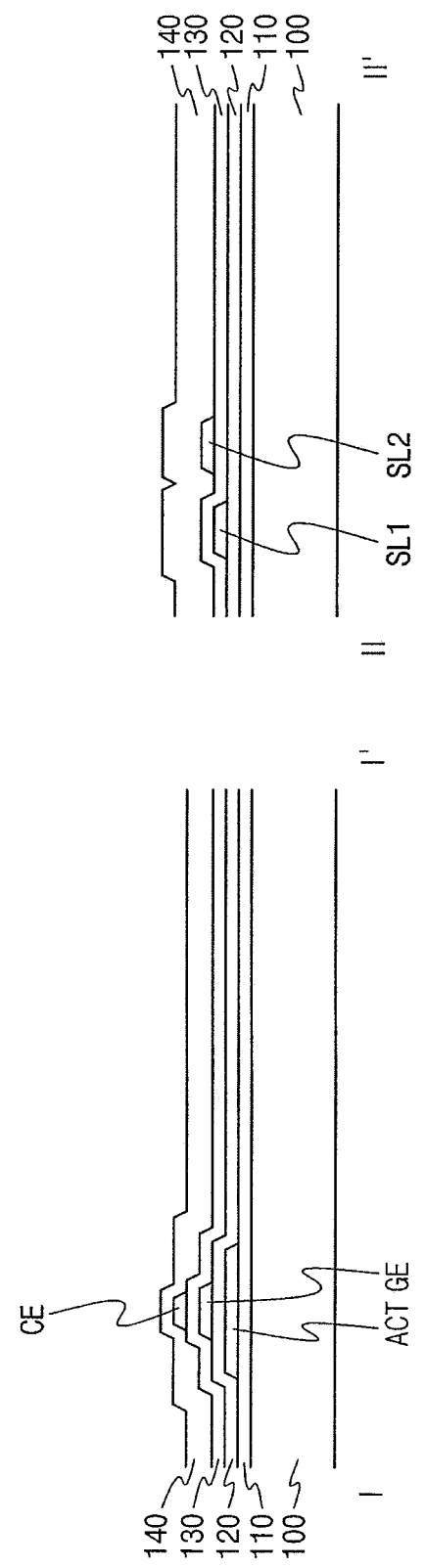
FIGS. 12A to 12D illustrate cross-sectional views of stages in a method of manufacturing the display apparatus of FIG. 6.

Referring to FIG. 12A, a buffer layer 110, an active pattern ACT, a gate insulating layer 120, a first gate pattern including a gate electrode GE and a first signal line SL1, a first insulating layer 130, a second gate pattern including a storage electrode CE and a second signal line SL2, and a second insulating layer 140 may be formed on a base substrate 100.

Figure 12B:
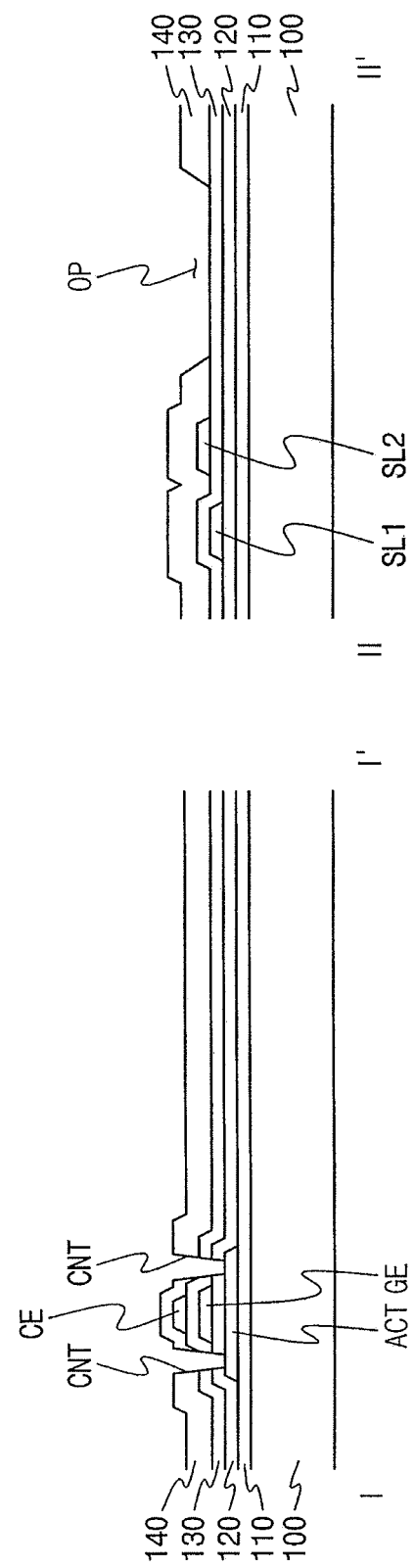

Referring to FIG. 12B, the second insulation layer 140, the first insulation layer 130, and the gate insulation layer 120 may be partially removed to form a contact hole CNT exposing the active pattern ACT. In addition, in the pad area, the second insulation layer 140 may be partially removed to form an opening OP to expose the first insulation layer 130. In an implementation, the opening OP and the contact hole CNT may be formed simultaneously using a halftone mask or the like.

Figure 12C:
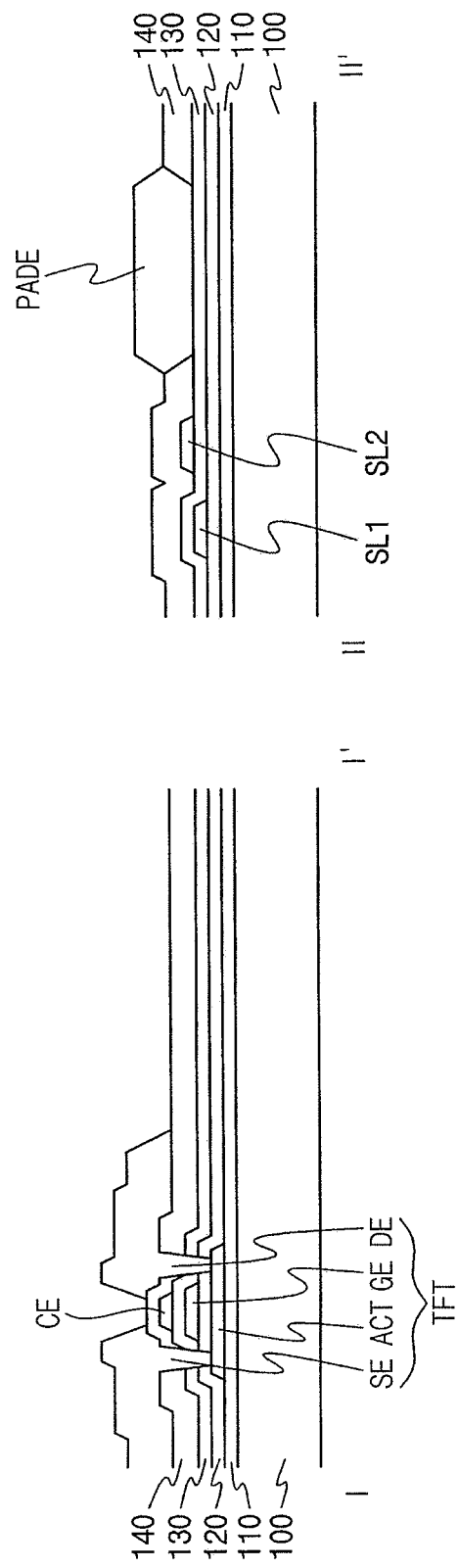

Referring to FIG. 12C, a conductive pattern layer (including a drain electrode DE and a pad electrode PADE) may be formed on the insulation layer 140. A conductive layer may be formed on the insulation layer 140, and then the conductive layer may be patterned into the conductive pattern using a photolithography process or an etching process using an additional etching mask.

Figure 12D:
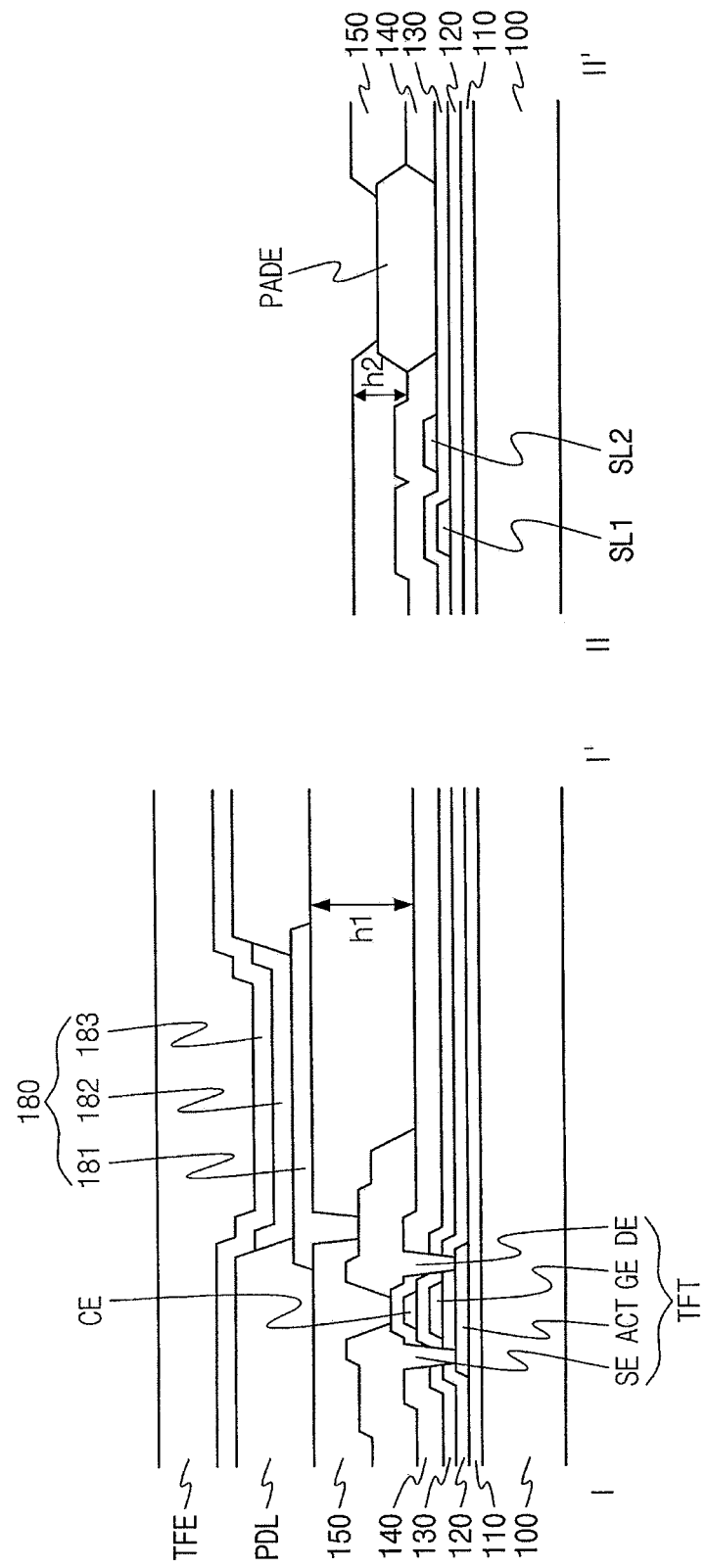

Referring to FIG. 12D, a via insulation layer 150, a first electrode 181, a pixel defining layer PDL, a light emitting layer 182, a second electrode 183, and a thin film encapsulation layer TFE 182 may be formed on the insulation layer 140 on which the conductive pattern layer is formed, whereby the display apparatus can be manufactured. The via insulation layer 150, the first electrode 181, the pixel defining layer PDL, the light emitting layer 182, the second electrode 183 and the thin film encapsulation layer TFE may be formed through suitable methods.

In addition, the manufacturing method of the display apparatus of FIG. 7 is similar to the manufacturing method of FIGS. 10A to 10C with respect to the first width W1 of the groove and the second width W2 of the pad electrode PADE, and others of the manufacturing method of the display apparatus of FIG. 7 may be similar to that of FIGS. 12A to 12D. Thus, detailed explanation of this may be omitted.

Figure 13A:
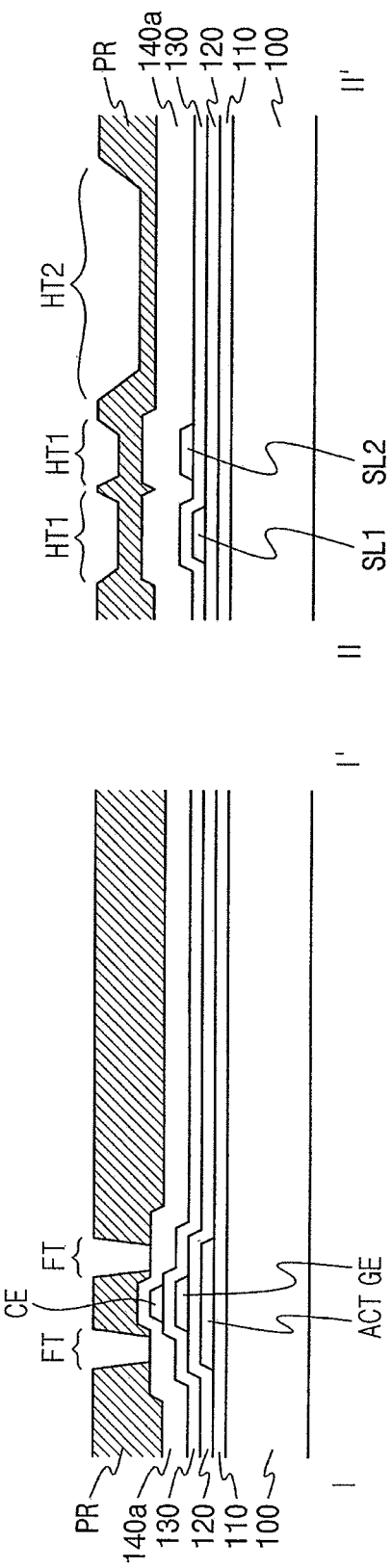
FIGS. 13A to 13C illustrate cross-sectional views of stages in a method of manufacturing the display apparatus of FIG. 8.
Figure 13B:
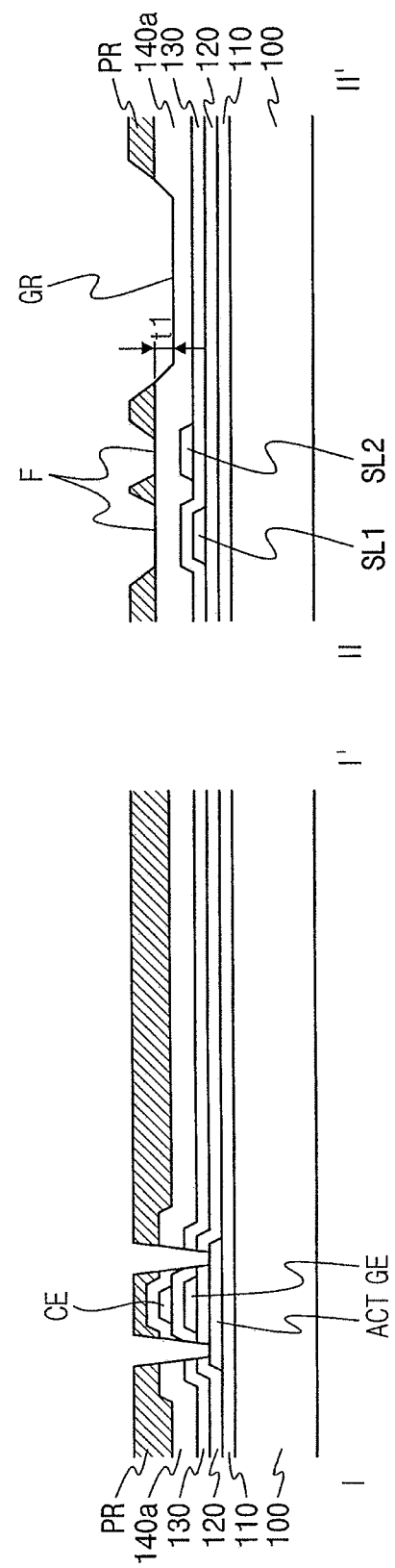
Figure 13C:
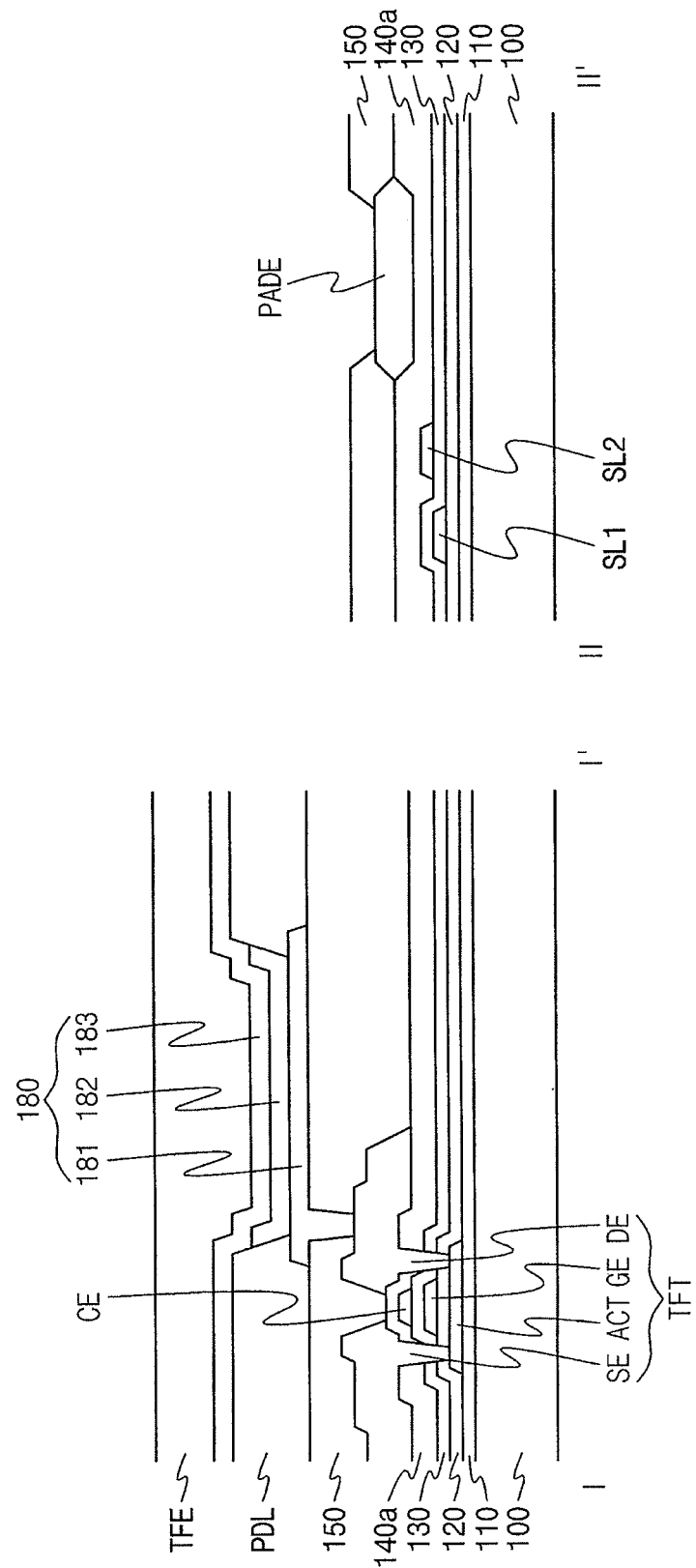

FIGS. 13A to 13C illustrate cross-sectional views of stages in a method of manufacturing the display apparatus of FIG. 8.

Referring to FIG. 13A, a buffer layer 110, an active pattern ACT, a gate insulating layer 120, a first gate pattern including a gate electrode GE and a first signal line SL1, a first insulating layer 130, a second gate pattern including a storage electrode CE and a second signal line SL2, and a second insulating layer 140 may be formed on a base substrate 100.

A photoresist pattern PR may be formed on the second insulating layer 140. A photoresist layer may be formed on the second insulating layer 140, and then the photoresist layer may be exposed and developed using a halftone mask to form the photoresist pattern PR. In an implementation, a portion where a contact hole is to be formed may correspond to a full-tone region FT, an upper portion of the first and second signal lines SL1 and SL2 may correspond to a first half-tone region HT1, and a portion where a groove is to be formed may correspond to a second halftone region HT2. Accordingly, the photoresist pattern may have an opening in the full-tone region FT, and concave portions (e.g., recesses) having different depths may be formed in the first halftone region HT1 and the second halftone region HT2.

Referring to FIG. 13B, the second insulating layer 140a may be patterned using the photoresist pattern. For example, the second insulation layer 140a, the first insulation layer 130, and the gate insulation layer 120 may be etched to form a contact hole CNT exposing the active pattern ACT in the full-tone region FT. In addition, in the first half-tone region HT1, a stepped portion of the second insulating layer 140a may be removed to form a flat upper surface F. In addition, in the second half-tone region HT2, a portion of the second insulating layer 140a may be removed to form a groove GR having a depth t1. Thereafter, the photoresist pattern may be removed.

Referring to FIG. 13C, a conductive pattern layer including a drain electrode DE and a pad electrode PADE may be formed on the insulation layer 140. A conductive layer may be formed on the insulation layer 140, and then the conductive layer may be patterned into the conductive pattern using a photolithography process or an etching process using an additional etching mask.

A via insulation layer 150, a first electrode 181, a pixel defining layer PDL, a light emitting layer 182, a second electrode 183, and a thin film encapsulation layer TFE 182 may be formed on the insulation layer 140 on which the conductive pattern layer is formed, whereby the display apparatus can be manufactured. The via insulation layer 150, the first electrode 181, the pixel defining layer PDL, the light emitting layer 182, the second electrode 183 and the thin film encapsulation layer TFE may be formed through suitable methods.

Figure 14:
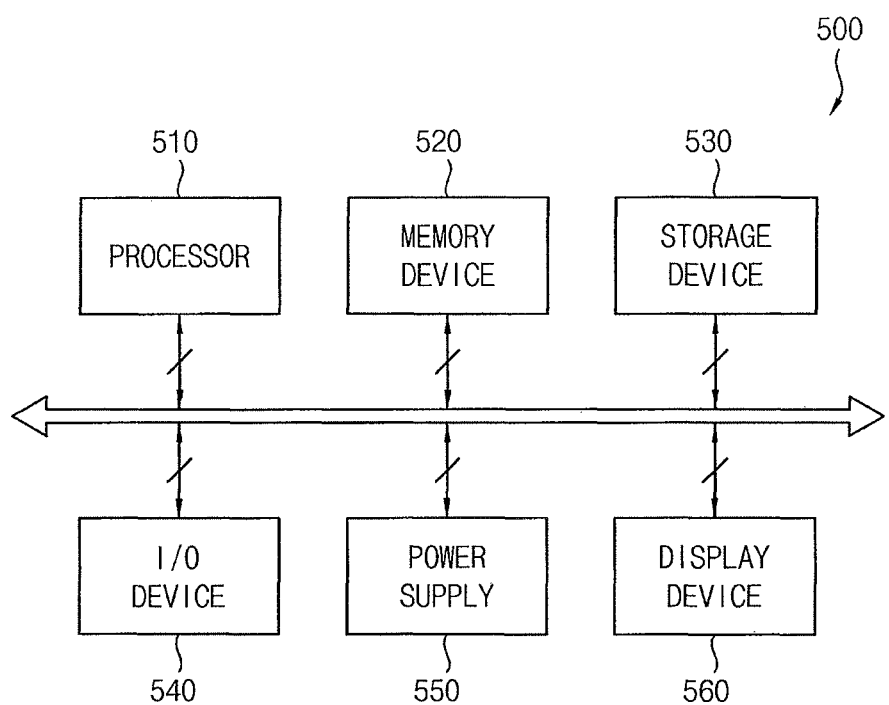
FIG. 14 illustrates a block diagram of an electronic device according to example embodiments.
Figure 15A:
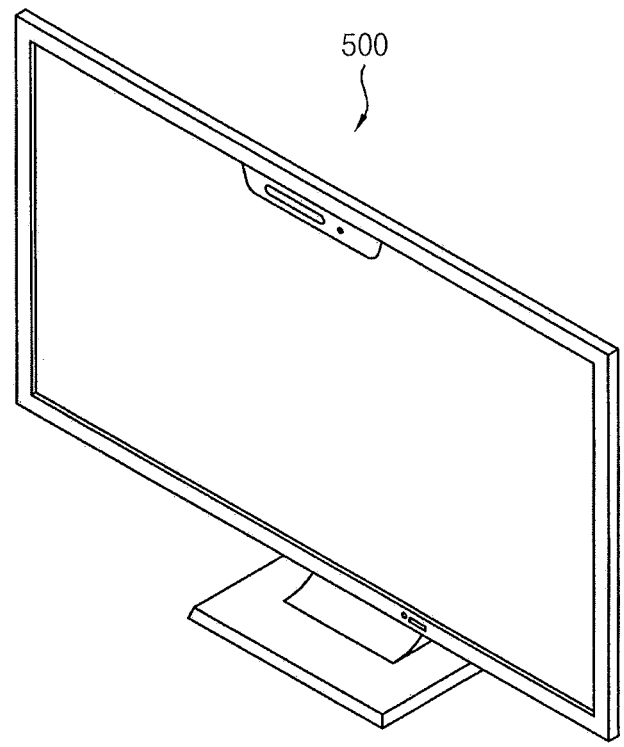
FIG. 15A illustrates a diagram of an example in which the electronic device of FIG. 14 is implemented as a television.
Figure 15B:
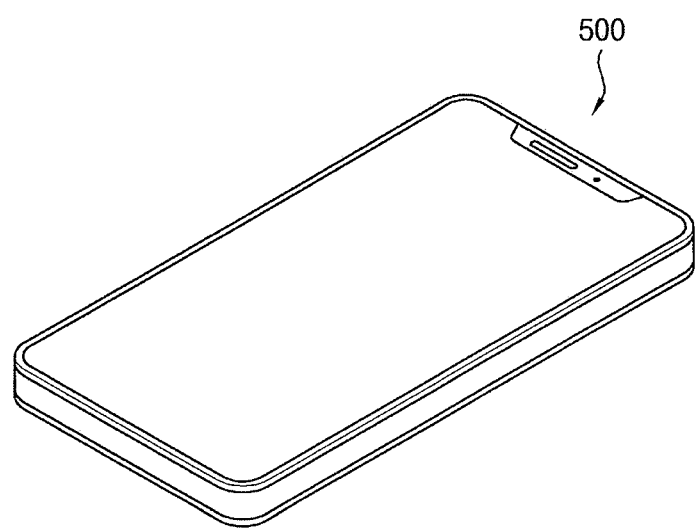
FIG. 15B illustrates a diagram of an example in which the electronic device of FIG. 14 is implemented as a smart phone.

FIG. 14 illustrates a block diagram of an electronic device according to example embodiments. FIG. 15A illustrates a diagram of an example in which the electronic device of FIG. 14 is implemented as a television. FIG. 15B illustrates a diagram of an example in which the electronic device of FIG. 14 is implemented as a smart phone.

Referring to FIGS. 14 through 15B, the electronic device 500 may include a processor 510, a memory device 520, a storage device 530, an input/output (I/O) device 540, a power supply 550, and a display device 560. Here, the display device 560 may correspond to the display apparatus of FIG. 1. In addition, the electronic device 500 may further include a plurality of ports for communicating with a video card, a sound card, a memory card, a universal serial bus (USB) device, other electronic devices, etc. In an implementation, as illustrated in FIG. 15A, the electronic device 500 may be implemented as a television. In an implementation, as illustrated in FIG. 15B, the electronic device 500 may be implemented as a smart phone. In an implementation, the electronic device 500 may be implemented as a cellular phone, a video phone, a smart pad, a smart watch, a tablet PC, a car navigation system, a computer monitor, a laptop, a head mounted display (HMD), etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, or the like, and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touchscreen, or the like and an output device such as a printer, a speaker, or the like. The power supply 550 may provide power for operations of the electronic device 500.

The display device 560 may be coupled to other components via the buses or other communication links. In an implementation, the display device 560 may be included in the I/O device 540. As described above, a pad electrode may be in a groove or an opening formed in an insulating layer and a step difference from an upper surface of the insulating layer can be reduced, so that it is possible to prevent lifting of a via insulation layer on the insulation layer. As a result, it is possible to improve adhesiveness of a conductive film for adhering a driver, reduce defects, and improve the display quality.

The embodiments may be applied to organic light emitting display devices and various electronic devices including the same. For example, the embodiments may be applied to a mobile phone, a smart phone, a video phone, a smart pad, a smart watch, a tablet PC, a car navigation system, a television, a computer monitor, a notebook, and the like.

By way of summation and review, a display apparatus may include a structure such as a plurality of conductive pattern layers and a plurality of insulation layers. Breakage of the structure could occur due to structural problems, process problems, etc. Accordingly, deterioration of image quality could occur.

One or more embodiments may provide a display apparatus capable of reducing defects.

One or more embodiments may provide a display apparatus capable of reducing defects and improving display quality.

According to the exemplary embodiments, the groove having a depth on the insulation layer may be formed in the pad area of the display apparatus, and the pad electrode may be in the groove, so that a step between the pad electrode and the insulation layer may be reduced. According to the step, a stress applied to the via insulation layer on the insulation layer may be reduced, as compared with the case where the groove is not formed. Accordingly, it is possible to help prevent the via insulation layer around the pad electrode from being damaged or lifted.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
    a display area;
    a pad area outside the display area;
    a base substrate in both the display area and the pad area;
    a thin film transistor on the base substrate in the display area;
    an insulation layer on the base substrate and the thin film transistor;
    a conductive pattern layer on the insulation layer, the conductive pattern layer including a pad electrode in the pad area; and
    a via insulation layer on the insulation layer, the via insulation layer exposing an upper surface of the pad electrode and covering edges of the pad electrode, wherein
    in the pad area, the insulation layer includes a groove having a depth, a portion of the pad electrode being in the groove, wherein
    a thickness of the portion of the pad electrode is greater than the depth of the groove, and the groove does not penetrate to a bottom of the insulation layer, and
    in the pad area, a bottom surface of the pad electrode in the groove makes direct contact with either the insulation layer, or another insulation layer beneath the insulation layer.

2. The display apparatus as claimed in claim 1, wherein a thickness of the conductive pattern layer is greater than the depth of the groove.

3. The display apparatus as claimed in claim 2, wherein the insulation layer includes an inorganic insulation material.

4. The display apparatus as claimed in claim 3, wherein the via insulation layer includes an organic insulation material.

5. The display apparatus as claimed in claim 4, wherein the via insulation layer has a first height in the display area and has a second height in the pad area, the second height being smaller than the first height.

6. The display apparatus as claimed in claim 1, wherein:
    the groove has a first width at an upper surface of on the insulation layer, and
    the pad electrode has a second width that is smaller than the first width.

7. The display apparatus as claimed in claim 1, wherein the thin film transistor includes:
    an active pattern on the base substrate;
    a gate electrode on the active pattern; and
    a source electrode and a drain electrode included in the conductive pattern layer.

8. The display apparatus as claimed in claim 7, further comprising a light emitting structure on the via insulation layer and electrically connected to the drain electrode.

9. The display apparatus as claimed in claim 1, further comprising:
    a first gate insulation layer on the insulation layer and the base substrate; and
    a first gate pattern between the gate insulation layer and the insulation layer, and including a first signal line in the pad area, wherein
    a thickness of the insulation layer on the first signal line is smaller than a thickness of the insulation layer adjacent to the first signal line.

10. The display apparatus as claimed in claim 9, wherein an upper surface of the insulation layer on the first signal line is flat.

11. The display apparatus as claimed in claim 1, further comprising a gate insulation layer between the insulation layer and the base substrate, wherein
    the groove of the insulation layer is an opening through the insulation layer that exposes the gate insulation layer.

12. The display apparatus as claimed in claim 1, wherein a thickness of the via insulation layer in the pad area is about 0.2 µm to 1.1 µm.

13. The display apparatus as claimed in claim 12, wherein a thickness of the pad electrode is about 0.2 µm to 1.2 µm.

14. The display apparatus as claimed in claim 1, wherein the insulation layer includes a plurality of layers including different materials.

15. The display apparatus as claimed in claim 1, further comprising:
- a conductive film on the pad electrode and including a conductive ball; and
- a driver on the conductive film, the driver being electrically connected to the pad electrode.

16. A method of manufacturing a display apparatus having a display area and a pad area outside the display area, the method comprising:
- forming an active pattern of a thin film transistor on a base substrate;
- forming an insulation layer on the active pattern;
- forming a contact hole and a groove in insulation layer such that the contact hole exposes the active pattern and the groove is in the pad area, the groove having a depth, wherein the groove does not penetrate to a bottom of the insulation layer;
- forming a conductive pattern layer, the conductive pattern layer including a drain electrode in the contact hole and a pad electrode in the groove, a portion of the pad electrode being in the groove, wherein a thickness of the portion of the pad electrode is greater than the depth of the groove; and
- forming a via insulation layer on the insulation layer such that the via insulation layer exposes the drain electrode and the pad electrode.

17. The method as claimed in claim 16, further comprising:
- forming a first electrode on the via insulation layer such that the first electrode is electrically connected to the drain electrode;
- forming a light emitting layer on the first electrode; and
- forming a second electrode on the light emitting layer.

18. The method as claimed in claim 16, further comprising forming a gate insulation layer on the base substrate prior to forming the insulation layer, wherein
- the groove is an opening formed through the insulation layer and exposing the gate insulation layer.

19. The method as claimed in claim 16, further comprising forming a gate pattern including a gate electrode and a signal line on the base substrate, prior to forming the insulation layer, wherein
- in forming the contact hole and the groove, a step of an upper surface of the insulation layer formed on the signal line is removed.

20. The method as claimed in claim 16, wherein:
- the groove has a first width at an upper surface of the insulation layer, and
- the pad electrode has a second width that is smaller than the first width.

* * * * *